(12) United States Patent
Chen et al.

(10) Patent No.: US 12,477,647 B2
(45) Date of Patent: Nov. 18, 2025

(54) SEMICONDUCTOR PACKAGE ASSEMBLY AND METHOD OF MANUFACTURING THE SAME

(71) Applicant: Taiwan Semiconductor Manufacturing Company, Ltd., Hsinchu (TW)

(72) Inventors: Jian-Ting Chen, Hsinchu County (TW); Cheng-Wei Lu, Hsinchu (TW); Kuang-Hua Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/352,267

(22) Filed: Jul. 14, 2023

(65) Prior Publication Data

US 2023/0363080 A1    Nov. 9, 2023

Related U.S. Application Data

(63) Continuation of application No. 17/461,947, filed on Aug. 30, 2021, now Pat. No. 11,778,727.

(51) Int. Cl.
*H05K 1/02* (2006.01)
*H01L 23/40* (2006.01)

(52) U.S. Cl.
CPC ....... *H05K 1/0207* (2013.01); *H01L 23/4093* (2013.01); *H05K 2201/068* (2013.01)

(58) Field of Classification Search
CPC .. H05K 1/0207; H05K 1/0209; H05K 1/0203; H05K 1/0204; H01L 23/4093
See application file for complete search history.

(56) References Cited

U.S. PATENT DOCUMENTS

| | | | |
|---|---|---|---|
| 2002/0097606 A1 * | 7/2002 | Kurokawa | G11C 16/12 365/185.18 |
| 2014/0321819 A1 * | 10/2014 | Zhao | G02B 6/4204 385/93 |
| 2021/0160997 A1 * | 5/2021 | Kirkpatrick | H05K 7/20509 |
| 2021/0173248 A1 * | 6/2021 | Lee | H05K 1/111 |

FOREIGN PATENT DOCUMENTS

EP          600590 A1 *  6/1994  ......... H01L 23/3672

* cited by examiner

*Primary Examiner* — Jeremy C Norris
(74) *Attorney, Agent, or Firm* — JCIPRNET

(57) ABSTRACT

A semiconductor package assembly includes a circuit board, a heat dissipating element and a semiconductor device. The circuit board includes a conductive pattern. The heat dissipating element is located on the circuit board, where the heat dissipating element is connected to the conductive pattern. The semiconductor device is located on the circuit board and next to the heat dissipating element, where the semiconductor device is thermally connected to the heat dissipating element through the conductive pattern.

20 Claims, 18 Drawing Sheets

SEMICONDUCTOR PACKAGE ASSEMBLY AND METHOD OF MANUFACTURING THE SAME

CROSS-REFERENCE TO RELATED APPLICATION

This application is a continuation application of and claims the priority benefit of a prior application Ser. No. 17/461,947, filed on Aug. 30, 2021, now allowed. The entirety of the above-mentioned patent application is hereby incorporated by reference herein and made a part of this specification.

BACKGROUND

Semiconductor devices and integrated circuits (ICs) are typically manufactured on a single semiconductor wafer. The dies of the wafer may be processed and packaged with other semiconductor devices or dies at the wafer level, and various technologies have been developed for the wafer level packaging. Semiconductor processing for fabrications of the semiconductor devices and ICs continues to evolve towards increasing device-density, higher numbers of active devices (mainly transistors) of ever decreasing device dimensions. As electronic products are continuously miniaturized, heat dissipation of the packaged semiconductor devices and ICs have become an important issue for packaging technology.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
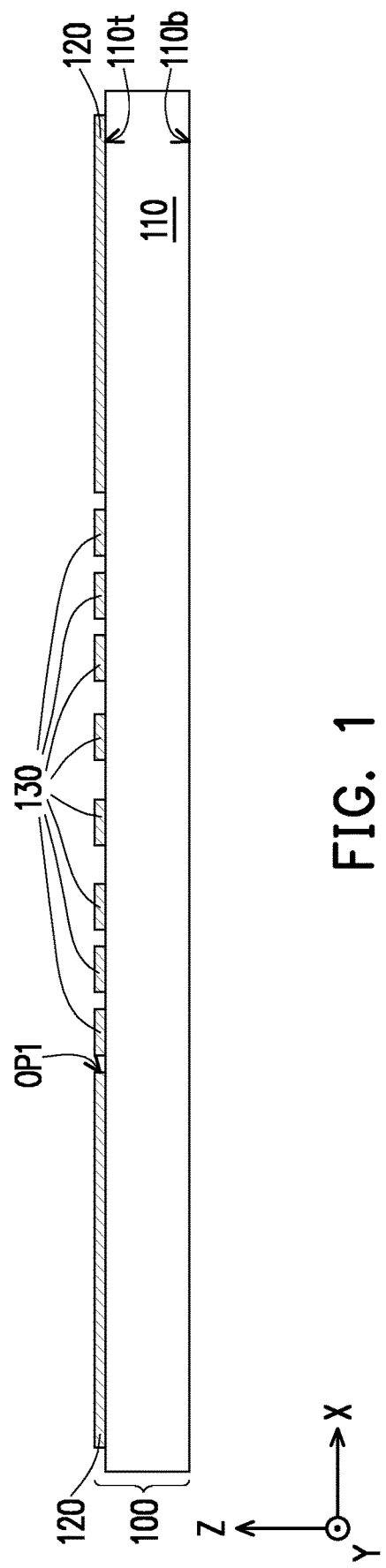
FIG. 1, FIG. 3, FIG. 5, FIG. 7 and FIG. 9 are schematic cross-sectional views showing a method of manufacturing a semiconductor package assembly in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

In accordance with some embodiments, a semiconductor package assembly includes a circuit board, a heat dissipating element and a semiconductor device. The heat dissipating element is located on and is connected to a conductive pattern of the circuit board. The semiconductor device is located on the circuit board and next to the heat dissipating element. The semiconductor device is thermally connected to the heat dissipating element through the conductive pattern. Accordingly, device temperature may be controlled with square cooling pattern to improve cooling efficiency.

Figure 6:
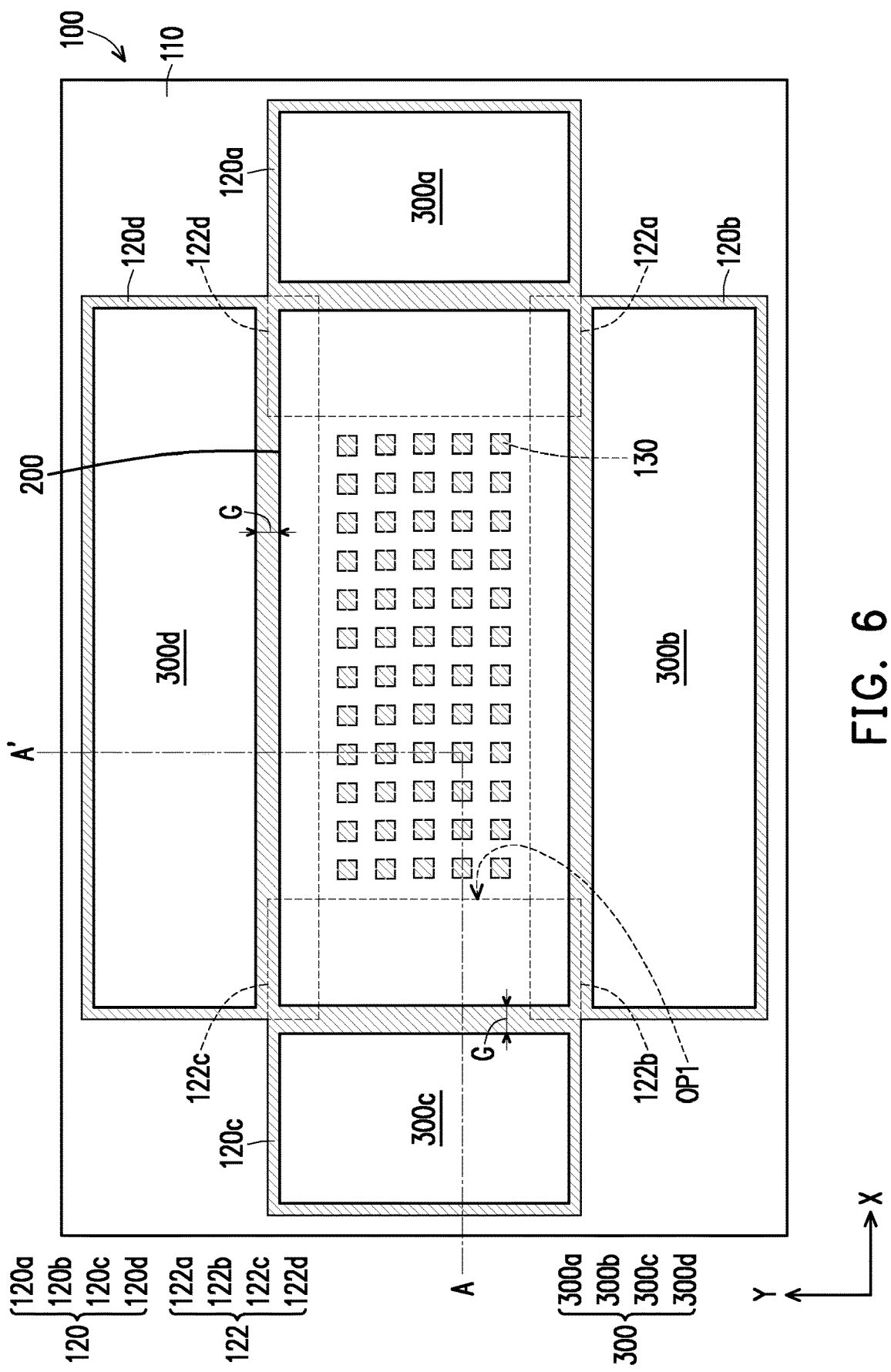
Figure 7:
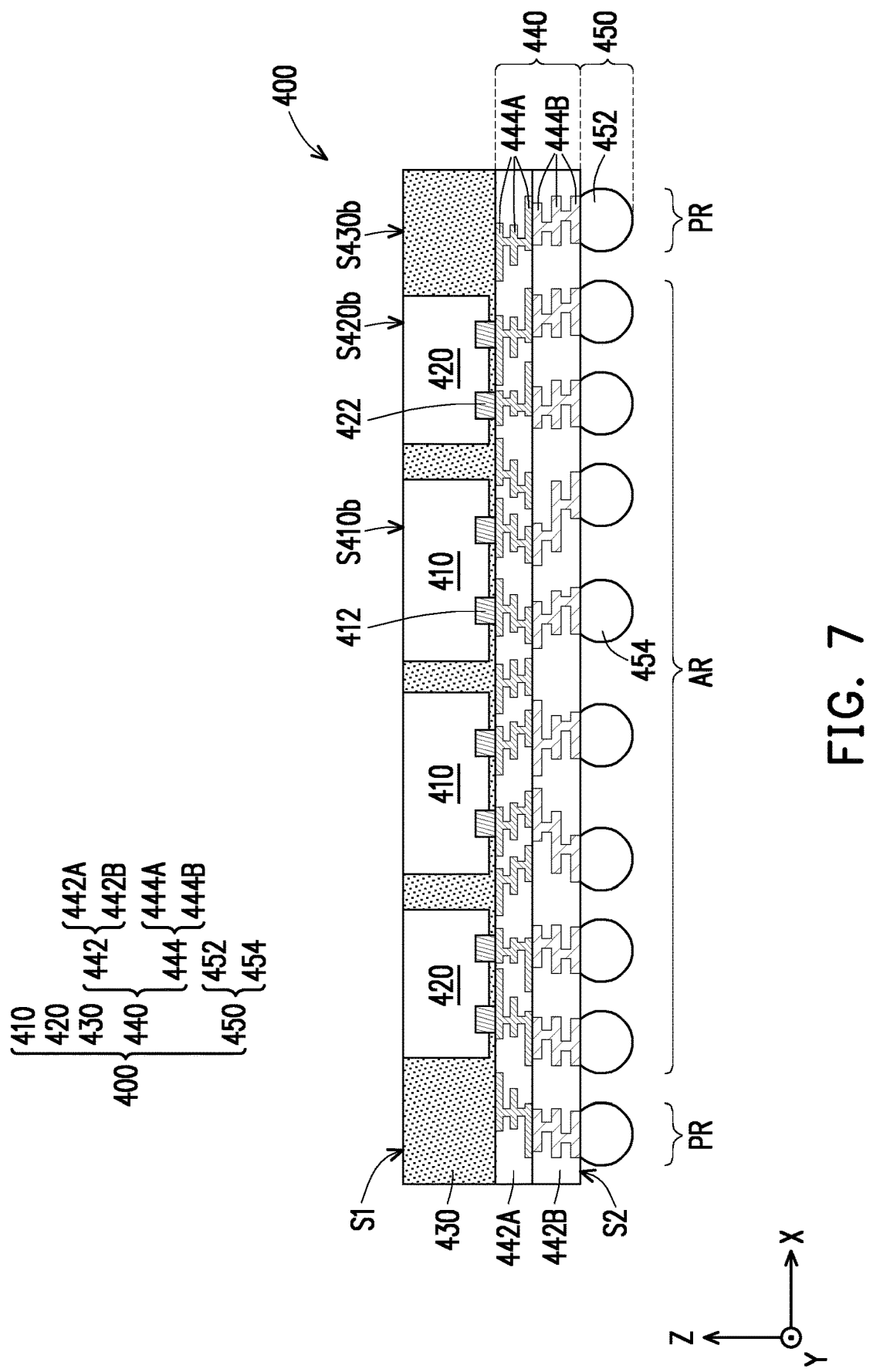
Figure 18:
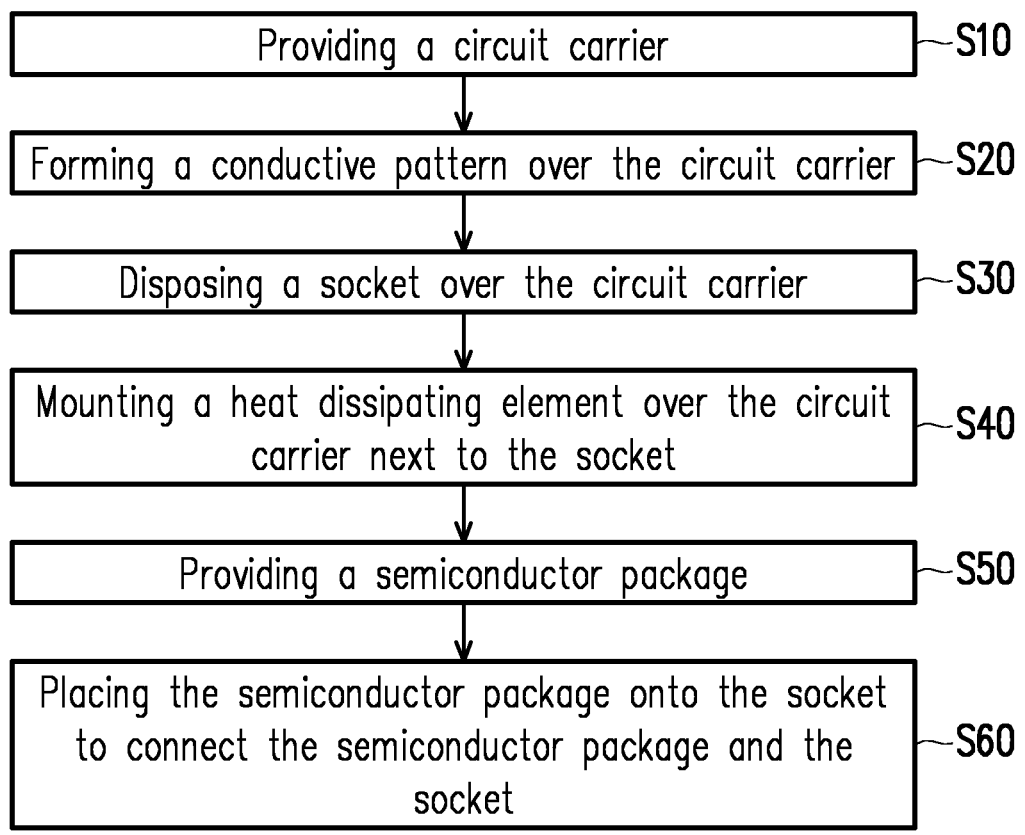
FIG. 18 is a flow chart illustrating a part of a method of manufacturing a semiconductor package assembly in accordance with some embodiments of the disclosure.

FIG. 1, FIG. 3, FIG. 5, FIG. 7 and FIG. 9 are schematic cross-sectional views showing a method of manufacturing a semiconductor package assembly SA1 in accordance with some embodiments of the disclosure. FIG. 2, FIG. 4, FIG. 6, FIG. 8 and FIG. 10 are schematic plane views illustrating a relative position of components included in the semiconductor package assembly SA1 depicted in FIG. 1, FIG. 3, FIG. 5, FIG. 7 and FIG. 9, respectively. FIG. 11 through FIG. 14 are respectively schematic top views illustrating a relative position of components included in a semiconductor package assembly in accordance with other embodiments of the disclosure. FIG. 18 is a flow chart illustrating a part of a method of manufacturing a semiconductor package assembly in accordance with some embodiments of the disclosure. FIG. 1, FIG. 3, FIG. 5 and FIG. 9 are the schematic cross-sectional views taken alone a cross-section line A-A' depicted in FIG. 2, FIG. 4, FIG. 6 and FIG. 10, while FIG. 7 is the schematic cross-sectional view taken alone a cross-section line B-B' depicted in FIG. 8. In FIG. 2, FIG. 4, FIG. 6 and FIG. 10, certain structural features shown in the respective cross-section views of FIG. 1, FIG. 3, FIG. 5 and FIG. 9 are omitted for easy illustration. In the disclosure, it should be appreciated that the illustration of components throughout all figures is schematic and is not in scale.

For example, in FIG. 1 through FIG. 10, one semiconductor package (or device) is shown to represent one or plural semiconductor packages (or devices), and one semiconductor package assembly is shown to represent one or plural semiconductor package assemblies obtained following the manufacturing method; the disclosure is not limited thereto. In other embodiments, multiple semiconductor packages (or devices) are shown to represent plural semiconductor packages (or devices), and multiple semiconductor package assemblies are shown to represent plural semiconductor package assemblies obtained following the manufacturing method. It is to be noted that the process steps described herein cover a portion of the manufacturing processes used to fabricate a semiconductor package assembly. The embodiments are intended to provide further explanations, but are not used to limit the scope of the disclosure.

Figure 2:
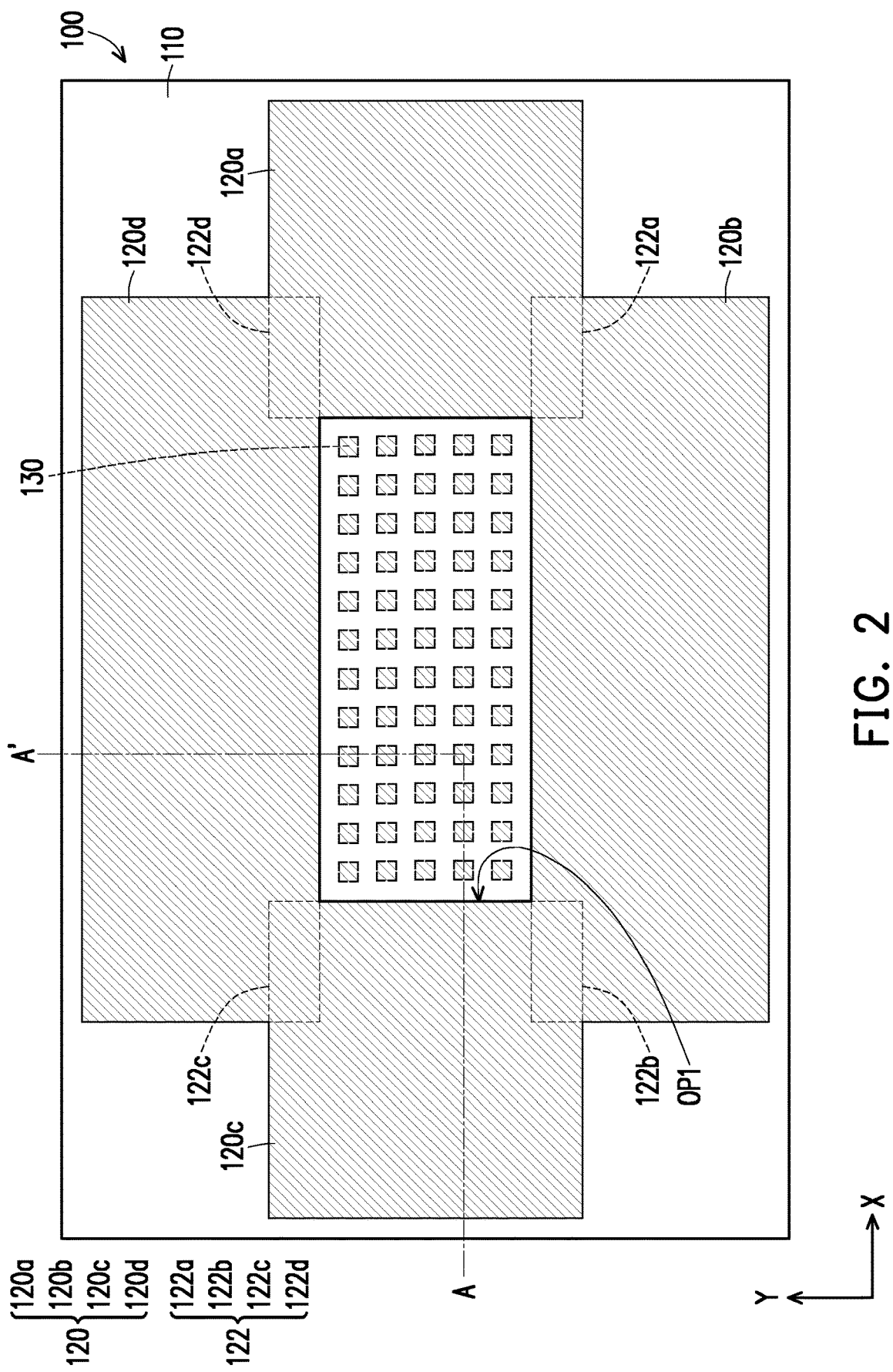
FIG. 2, FIG. 4, FIG. 6, FIG. 8 and FIG. 10 are schematic plane views illustrating a relative position of components included in the semiconductor package assembly depicted in FIG. 1, FIG. 3, FIG. 5, FIG. 7 and FIG. 9, respectively.

Referring to FIG. 1 and FIG. 2 together, in some embodiments, a circuit board 100 is provided, where the circuit board 100 includes a circuit carrier 110, a conductive pattern 120 over the circuit carrier 110 and a plurality of conductive contacts 130 over the circuit structure 100. The circuit carrier 110 may have a surface 110$t$ and a surface 110$b$ opposite to the surface 110$t$ along a direction Z. For example, the conductive pattern 120 and the conductive contacts 130 are next to each other and disposed on the surface of 110$t$ of the circuit carrier 100, as shown in FIG. 1. In some embodiments, the conductive pattern 120 is electrically connected to and thermally coupled to the circuit carrier 110. On the other hand, the conductive contacts 130 are separated from one another, where the conductive contacts 130 are electrically connected to and thermally coupled to the circuit carrier 110 and are electrically isolated from the conductive pattern 120. For the circuit board 100, the conductive contacts 130 are at least thermally coupled to the conductive pattern 120 through the circuit carrier 110, in some embodiments. For example, the conductive pattern 120 and the conductive contacts 130 are accessibly revealed from the circuit carrier 110 for connecting (e.g. at least in a manner of electrical coupling and/or thermal coupling) to a component disposing thereon.

The formation of the circuit board 100 may be formed by, but not limited to, the following steps: providing the circuit carrier 110 (in accordance with step S10 of FIG. 18), where the circuit carrier 110 includes a substrate (or referred to as a circuit structure), and the structure includes a plurality of first contact pads (not shown) and a plurality of second contact pads (not shown) located at opposite sides of the substrate and an internal circuitry (not shown) embedded inside the substrate for electrically connecting the first contact pads and the second contact pads; and forming the conductive pattern 120 over the circuit carrier 110 (in accordance with step S20 of FIG. 18), where the conductive pattern 120 is electrically connected to and thermally coupled to the circuit carrier 110 via a direct contact between the conductive pattern 120 and the first contact pads or between the conductive pattern 120 and the second contact pads. During forming the conductive pattern 120, the conductive contacts 130 may be formed simultaneously. Alternatively, the conductive contacts 130 may be formed prior to the formation of the conductive pattern 120 or after the formation of the conductive pattern 120; the disclosure is not limited thereto. The circuit board 100 may be an organic circuit structure, a printed circuit board (PCB), a system board, or the like.

The substrate may be made of a dielectric material; for example, a polymer such as polyimide (PI), polybenzoxazole (PBO), benzocyclobutene (BCB), a nitride such as silicon nitride, an oxide such as silicon oxide, a silicon oxynitride, phosphosilicate glass (PSG), borosilicate glass (BSG), boron-doped phosphosilicate glass (BPSG), a combination thereof or the like. The first contact pads may be distributed on a top surface (e.g., 110$t$) of the substrate, and the second contact pads may be distributed on a bottom surface (e.g., 110$b$) of the substrate, or vice versa. For example, the top surface is opposite to the bottom surface along the direction Z as shown in FIG. 1. In this case, the internal circuitry embedded inside the substrate is electrically connecting the first contact pads and the second contact pads, thereby constituting the circuit carrier 110.

In some embodiments, the first contact pads and the second contact pads are respectively distributed over two opposite sides of the substrate and are accessibly exposed for electrically connecting with later-formed elements/features (e.g., the conductive pattern 120, the conductive contacts 130, a signal source, a power source, the like, or combinations thereof). In some embodiments, the first contact pads and the second contact pads may independently include copper pads, aluminum pads, or the like. The materials of the first contact pads may be the same as the materials of the second contact pads. Alternatively, the materials of the first contact pads may be different from the materials of the second contact pads. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In some embodiments, the internal circuitry includes a plurality of metallization layers and a plurality of vias, where the metallization layers and the vias are alternately arranged along the direction Z and are embedded in the substrate, and two immediately adjacent metallization layers are connected to each other through at least one via interposed therebetween; thereby providing a routing function for the circuit carrier 110. That is, the first contact pads are electrically coupled to the second contact pads through the internal circuitry (including the metallization layers and the vias), for example. On the other hand, in some other embodiments, besides above electrical connection between the first contact pads and the second contact pads, one of the first contact pads is electrically coupled to another first contact pad through the internal circuitry, and/or one of the second contact pads is electrically coupled to another second contact pad through the internal circuitry. The materials of the internal circuitry may include conductive materials formed by electroplating or deposition, such as aluminum, titanium, copper, nickel, tungsten, and/or alloys thereof, which may be patterned using a photolithography and etching processes. In some embodiments, the metallization layers included in the internal circuitry are patterned copper layers, and the vias included in the internal circuitry are copper vias. The materials of the metallization layers and the vias may be the same, the disclosure is not limited thereto. Alternatively, the material of the metallization layers may be different from the material of vias.

However, the disclosure is not limited thereto; alternatively, the internal circuitry may include through-insulator vias embedded to the substrate for connecting the first contact pads and the second contact pads. In such case, the through-insulator vias included in the internal circuitry are copper vias.

As illustrated in FIG. 1 and FIG. 2, in some embodiments, the conductive pattern 120 is formed on the surface 110t of the circuit carrier 110. In some embodiments, the conductive pattern 120 is electrically connected to and thermally coupled to the circuit carrier 110 through a connection between the conductive pattern 120 and the circuit carrier 110 (e.g., connecting the conductive pattern 120 to the first contact pads or the second contact pads). The conductive pattern 120 may be formed, but not limited to, by, but not limited to, conformally forming a blanket layer of a conductive material over the circuit carrier 110 and patterning the conductive material layer into a pre-determined pattern on the circuit carrier 110 to form the conductive pattern 120. For example, the conductive pattern 120 is in a form of cross-shape with an opening OP1 located at the center thereof. The opening OP1 may correspond to a positioning location of a later-disposed component, such as a socket 200 (described later in FIG. 3 and FIG. 4) or a semiconductor package 400 (described later in FIG. 7 and FIG. 8). In some embodiments, the opening OP1 is in a quadrilateral form such as a rectangle or a square, as shown in FIG. 2. Alternatively, the opening OP1 may be in a form of a circular shape or an elliptical shape.

The conductive pattern 120 may include a plurality of sub-patterns 120a, 120b, 120c and 120d as shown in FIG. 2. For example, the sub-patterns 120a through 120d are formed in a same layer, where each of the sub-patterns 120a through 120d is in a form of a quadrilateral, and any two adjacent sub-patterns 120a, 120b, 120c and 120d are connected to each other via a shared portion 122 (including 122a, 122b, 122c and 122d), as shown in FIG. 2. That is, the sub-patterns 120a and 120b are connected through a shared portion 122A, the sub-patterns 120b and 120c are connected through a shared portion 122B, the sub-patterns 120c and 120d are connected through a shared portion 122C, and the sub-patterns 120d and 120a are connected through a shared portion 122D. The sub-patterns 120a, 120b, 120c and 120d may be different in the plane view projecting in the direction Z, in part or all. For example, as shown in FIG. 2, the sizes and shapes of the sub-patterns 120a and 120c are substantially identical (such as square shapes), the sizes and shapes of the sub-patterns 120b and 120d are substantially identical (such as rectangular shapes), and the sizes and shapes of the sub-patterns 120a and 120c are different from the sizes and shapes of the sub-patterns 120b and 120d. Alternatively, the sizes and shapes of the sub-patterns 120a, 120b, 120c and 120d in the plane view may be the same, such as rectangular shapes in FIG. 11.

Figure 12:
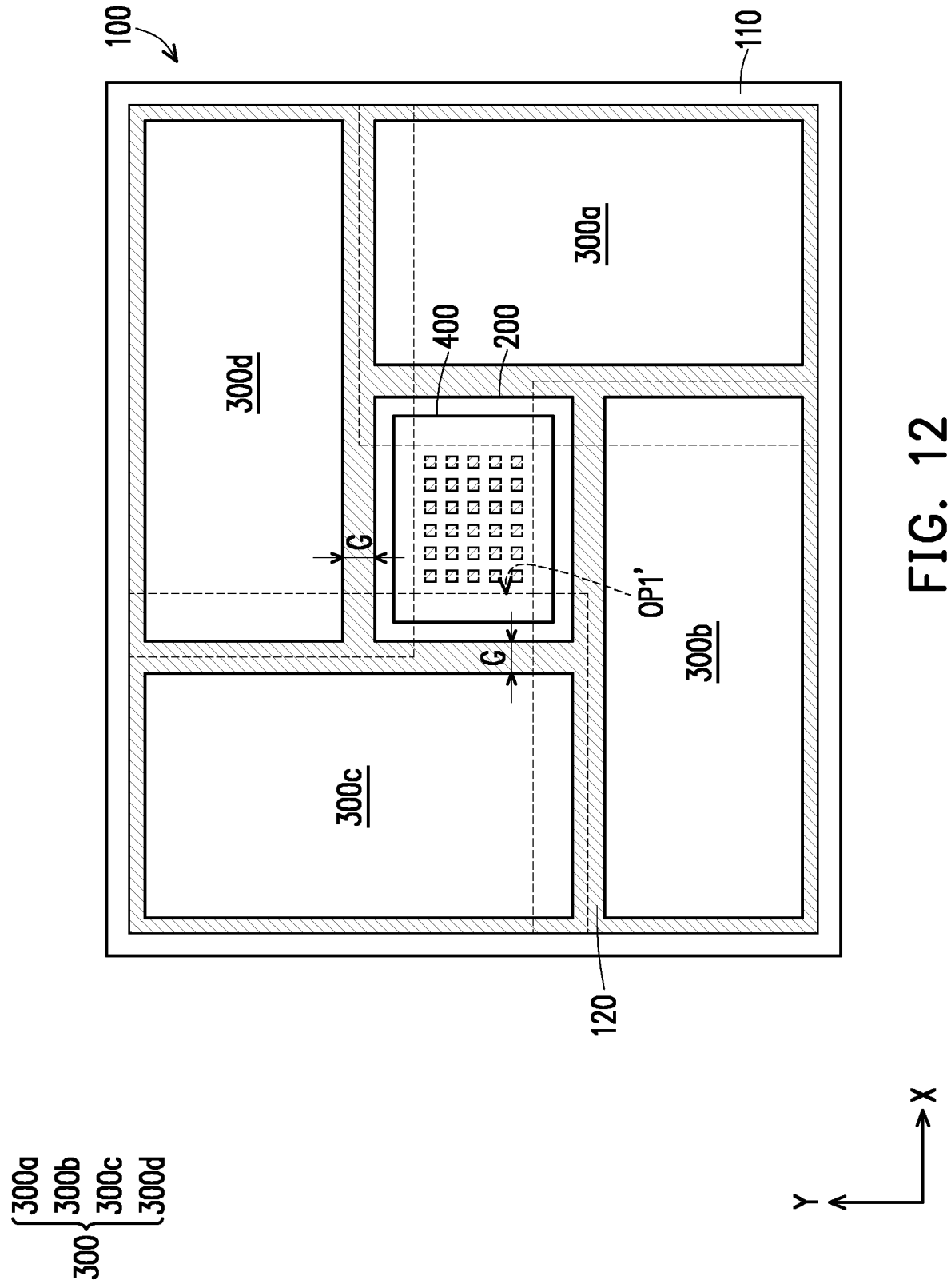
FIG. 12 is a schematic top view illustrating a relative position of components included in a semiconductor package assembly in accordance with other embodiments of the disclosure.
Figure 13:
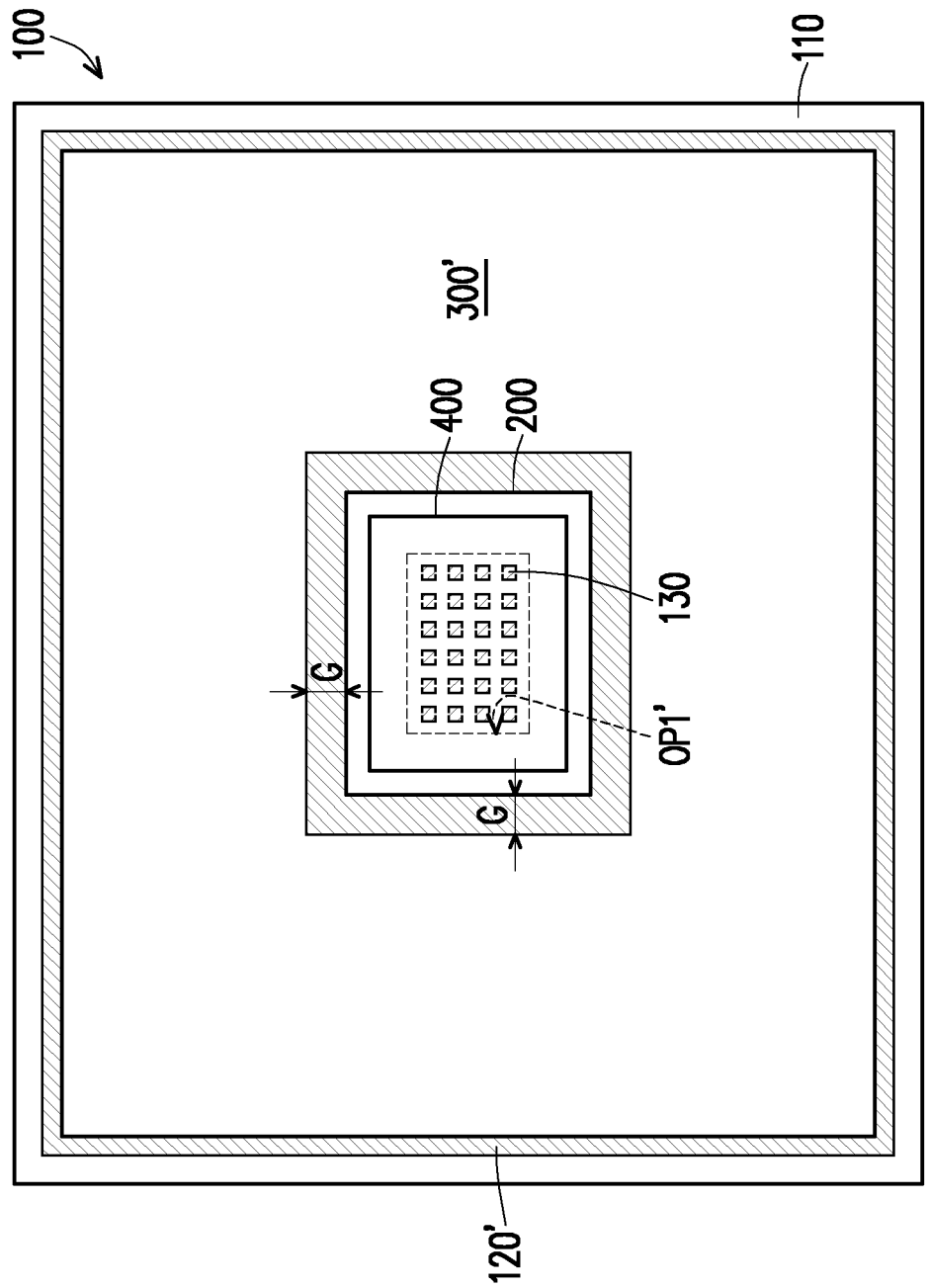
FIG. 13 is a schematic top view illustrating a relative position of components included in a semiconductor package assembly in accordance with other embodiments of the disclosure.
Figure 14:
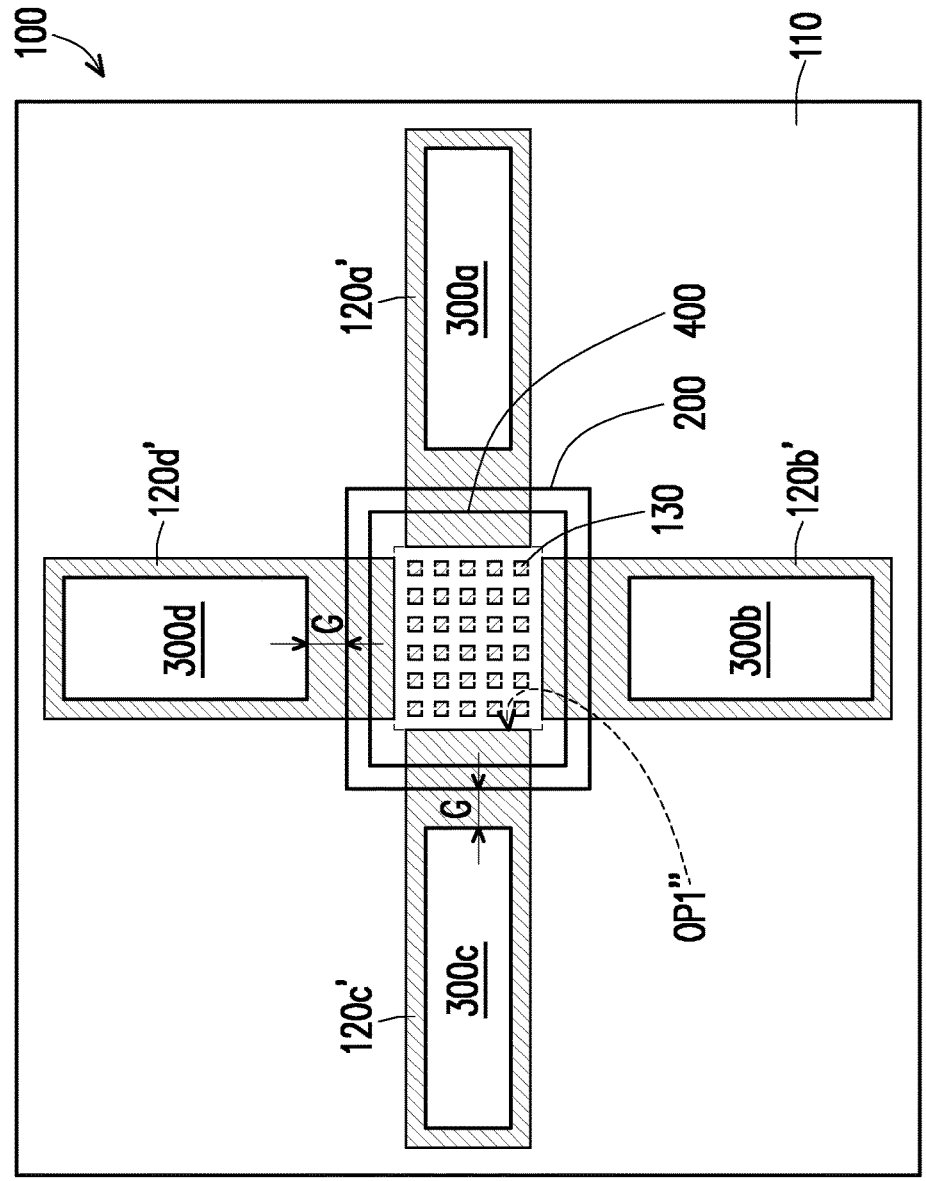
FIG. 14 is a schematic top view illustrating a relative position of components included in a semiconductor package assembly in accordance with other embodiments of the disclosure.

However, the disclosure is not limited thereto. In other embodiments, the conductive pattern 120' is formed in a frame shape (FIG. 12 and FIG. 13), where the frame shape includes a square annulus or a rectangle annulus having the opening OP1' therein. For example, the opening OP1' is in a quadrilateral form such as a rectangle or a square, as shown in FIG. 12 and FIG. 13. Alternatively, the opening OP1' may be in a form of a circular shape or an elliptical shape. In further alternative embodiments, as shown in FIG. 14, a conductive pattern 120" may include a plurality of the sub-patterns 120a', 120b' 120c' and 120d', where the sub-patterns 120a', 120b' 120c' and 120d' are separated from one another and are arranged in a concentric manner with an opening OP1" located at the center of and surrounded by the sub-patterns 120a', 120b' 120c' and 120d'.

The conductive material of the conductive pattern 120 may include a material that is electrically conductive and thermally conductive. In some embodiments, the conductive material of the conductive pattern 120 includes a metal or metal alloy, formed by electroplating or deposition. The conductive material may include copper, aluminum, titanium, steel, nickel, tungsten, and/or alloys thereof, which may be patterned using a photolithography and etching process. For example, the conductive pattern 120 includes a suitable thermally conductive material having a thermal conductivity more than 200 W/(m·K), such as copper or aluminum. Owing to the conductive pattern 120, the heat generated from or transmitted to the circuit carrier 110 can be easily dissipating out from the circuit carrier 110 via the conductive pattern 120. In some embodiments, a thickness T120 of the conductive pattern 120 is approximately ranging from 17.5 μm to 105 μm.

Continued on FIG. 1, in some embodiments, the conductive contacts 130 are formed on the surface 110t of the circuit carrier 110. In some embodiments, the conductive contacts 130 are electrically connected to and thermally coupled to the circuit carrier 110 through a connection between the conductive contacts 130 and the circuit carrier 110 (e.g., connecting the conductive contacts 130 to the first contact pads or the second contact pads). The conductive contacts 130 are separated apart from each other and from the conductive pattern 120, where the conductive contacts 130 are located inside the opening OP1 of the conductive pattern 120, as shown in FIG. 2, for example. In other words, the conductive contacts 130 are surrounded by the conductive pattern 120, laterally. The conductive contacts 130 may be arranged in the form of a matrix, such as the N×N array or N×M array (N, M>0, N may or may not be equal to M) along a X-Y plane. The direction X and the direction Y are different form each other and the direction Z, where the direction Z is a stacking direction of the circuit carrier 110 and the conductive pattern 120. For example, the direction X is perpendicular to the direction Y, and the direction X and the direction Y independently perpendicular to the direction Z.

In some embodiments, the conductive contacts 130 may be made of conductive materials formed by electroplating or deposition, such as aluminum, titanium, copper, nickel, tungsten, and/or alloys thereof, which may be patterned using a photolithography and etching process. In some embodiments, the conductive contacts 130 may be copper conductive patterns or aluminum conductive patterns. In some embodiments, a thickness T130 of the conductive contacts 130 is approximately ranging from 17.5 μm to 105 μm. The number of the conductive contacts 130 shown in FIG. 1 and FIG. 2 is for illustrative proposes only, and the disclosure is not limited thereto. The number of the conductive contacts 130 may be selected and designated based on the demand and design layout.

In one embodiment, the material of the conductive pattern 120 is the same as the materials of the conductive contacts 130. In an alternative embodiment, the material of the conductive pattern 120 is different from the materials of the conductive contacts 130. The disclosure is not specifically limited thereto. In some embodiments, the first contact pads or the second contact pads in contact with the conductive pattern 120 are electrically floating to the first contact pads or the second contact pads in contact with the conductive contacts 130.

Figure 3:
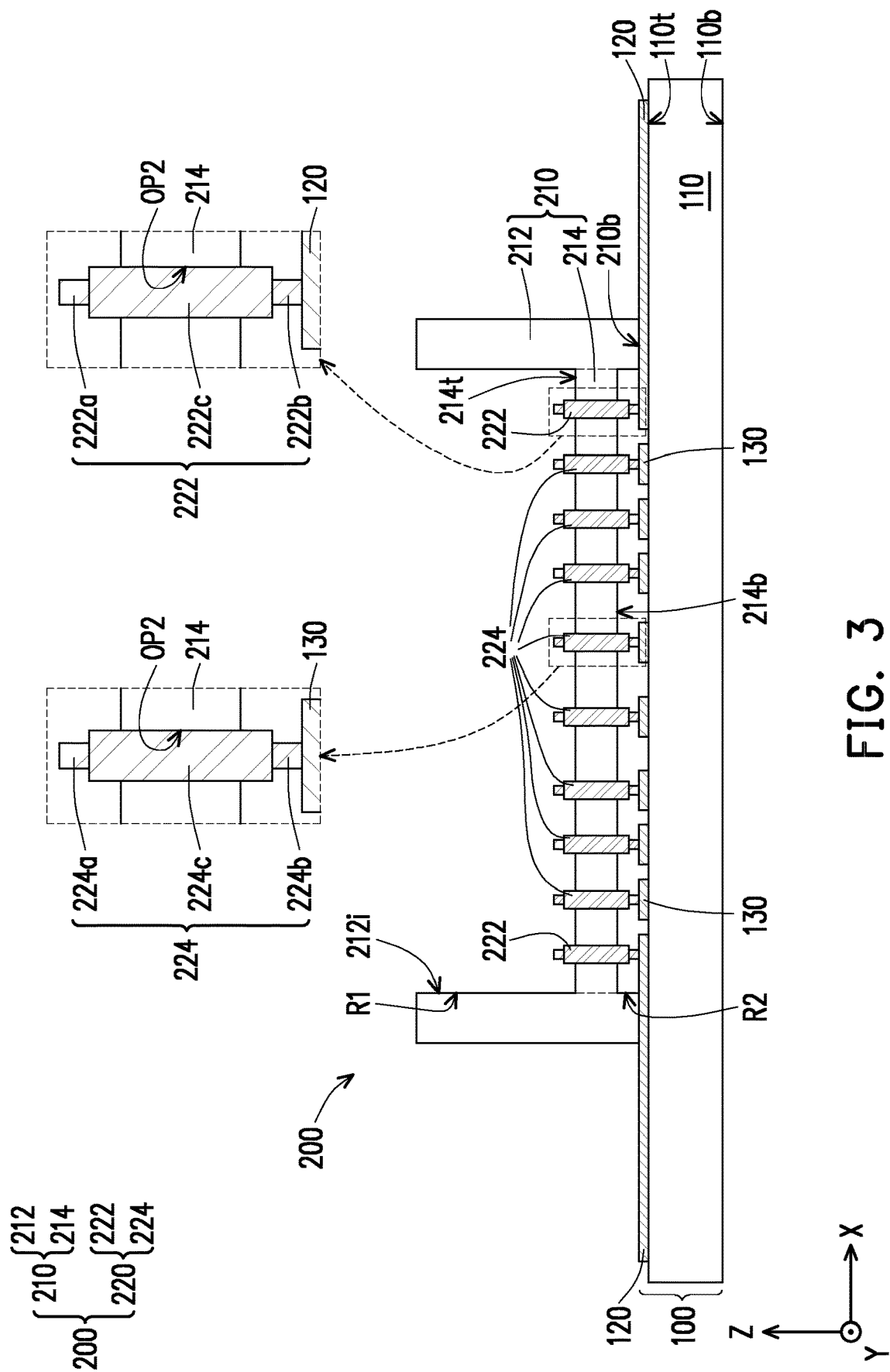
Figure 4:
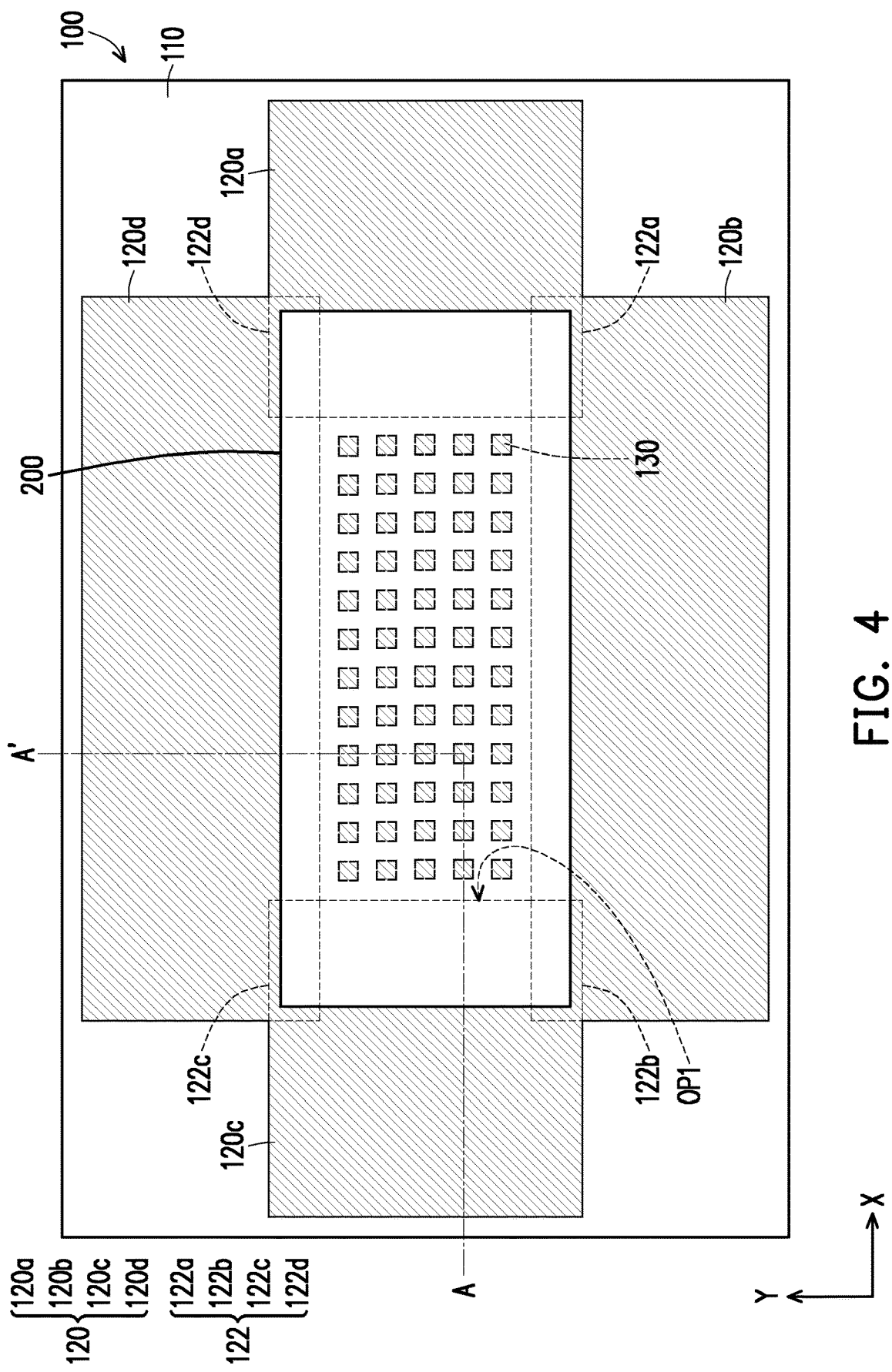

Referring to FIG. 3 and FIG. 4 together, in some embodiments, a socket 200 is disposed over the circuit carrier 110, in accordance with step S30 of FIG. 18. As illustrated in FIG. 3 and FIG. 4, for example, the socket 200 stands on the conductive pattern 120, where the socket 200 is partially overlapped with the conductive pattern 120 in the vertical projection on the circuit board 100 along the direction Z. The socket 200 may be mounted onto the circuit board 100 through a holding device (not shown) including a plurality of blots and a plurality of fasteners. In some embodiments, the bolts penetrate through the socket 200 (e.g. the flange portion 212) and the circuit board 100 at corners of the socket 200, and the fasteners are respectively threaded onto the bolts and tightened to clamp the socket 200 and the circuit board 100. The fasteners may be, e.g., nuts that thread to the bolts. For example, as shown in FIG. 3, the flange portion 212 of the base 210 of the socket 200 directly stands on a surface of the conductive pattern 120.

For example, the socket 200 includes a base 210 and a plurality of conductive connectors 220 penetrating therethrough, as shown in FIG. 3. In some embodiments, the base 210 is electrically isolated from the conductive connectors 220, and is further electrically isolated from the conductive pattern 120 and the conductive contacts 130. In some embodiments, the base 210 includes a flange portion 212 and a central portion 214, where the flange portion 212 is at a periphery of the central portion 214. For example, as shown in FIG. 3, a cross-section of the base 210 is in a H-shape. On the other hand, in the top view of FIG. 4, the base 210 may be in a rectangular shape. Alternatively, in the top view, the base 210 may be in a square-shape, a circle-shape, an ellipse-shape, or any suitable polygonal shape. In some embodiments, the material of the base 210 include a dielectric material capable of providing a specific stiffness that ensuring the physical and mechanical strength of the sockets 200. The stiffness (which may be quantified by its Yong's modulus) can be in the range of about 10 GPa to about 30 GPa.

The flange portion 212 and the central portion 214 may together confine at least two recesses (e.g. R1 and R2) inside the socket 200. For example, as shown in FIG. 3, a recess R1 is confined by an inner surface 212$i$ of the flange portion 212 and a surface 214$t$ of the central portion 214, and a recess R2 is confined by the inner surface 212$i$ of the flange portion 212 and a surface 214$b$ of the central portion 214. For example, the surface 214$t$ is opposite to the surface 214$b$ along the direction Z, where the surface 214$t$ is facing away from the circuit board 100 while the surface 214$b$ is facing towards the circuit board 100. In some embodiments, the recess R1 is configured to be an accommodating space for the semiconductor package 400 (described later in FIG. 7 and FIG. 8). In some embodiments, the conductive contacts 130 are in the recess R2, where the conductive contacts 130 are enclosed by the socket 200, the conductive pattern 120 and the circuit carrier 110. In other words, the recess R2 is spatially communicated to the opening OP1, for example.

The central portion 214 may include a plurality of openings OP2. For example, as shown in FIG. 3, the openings OP2 penetrate through the central portion 214 in the direction Z, where the conductive connectors 220 are respectively inserted into the openings OP2 and fixed to the base 210. For example, the conductive connectors 220 includes a plurality of conductive connectors 222 and a plurality of conductive connectors 224. In some embodiments, the conductive connectors 222 are in contact with the conductive pattern 120, where the conductive connectors 222 are electrically connected to and thermally coupled to the conductive pattern 120. In other words, positioning locations of the conductive connectors 222 are within a positioning location of the conductive pattern 120 in a vertical projection on the circuit board 100 along the direction Z. For example, multiple conductive connectors 222 are connected to (e.g., in contact with) each of sub-patterns 120$a$, 120$b$, 120$c$ and 120$d$. The conductive connectors 222 each may include a body portion 222$c$ and two end portions 222$a$, 222$b$ respectively connecting to two opposite sides of the body portion 222$c$. For example, as shown in FIG. 3, the conductive connectors 222 are connected to the conductive pattern 120 through the end portions 222$b$. The conductive pattern 120 may be electrically connected to and thermally coupled to the semiconductor package 400 through the end portions 222$a$ of the conductive connectors 222.

On the other hand, the conductive connectors 224 are respectively in contact with the conductive contacts 130, where the conductive connectors 224 are electrically connected to and thermally coupled to the conductive contacts 130. For example, each conductive connector 224 is connected to a respective one of the conductive contacts 130. In other words, positioning locations of the conductive connectors 224 are within positioning locations of the conductive contacts 130 in a vertical projection on the circuit board 100 along the direction Z. The conductive connectors 224 each may include a body portion 224$c$ and two end portions 224$a$, 224$b$ respectively connecting to two opposite sides of the body portion 224$c$. For example, as shown in FIG. 3, the conductive connectors 224 are respectively connected to the conductive contacts 130 through the end portions 224$b$. The conductive contacts 130 may be electrically connected to and thermally coupled to the semiconductor package 400 through the end portions 224$a$ of the conductive connectors 224.

In some embodiments, the conductive connectors 222 and the conductive connectors 224 are pogo pins to establish proper physical contacts between the end portions (e.g., 222$a$/222$b$, 224$a$/224$b$) and an overlying or underlying components (e.g., the semiconductor package 400 or the circuit board 100). Alternatively, the conductive connectors 222 and/or 224 may be any suitable conductive connectors which are capable of establishing the proper physical contacts as mentioned. Only two conductive connectors 222 and eight conductive connectors 224 are shown in FIG. 3 for illustrative purposes, the disclosure is not limited thereto. The numbers of the conductive connectors 220 (including 222 and 224) is selected and designated based on the demand and the design requirement.

Figure 5:
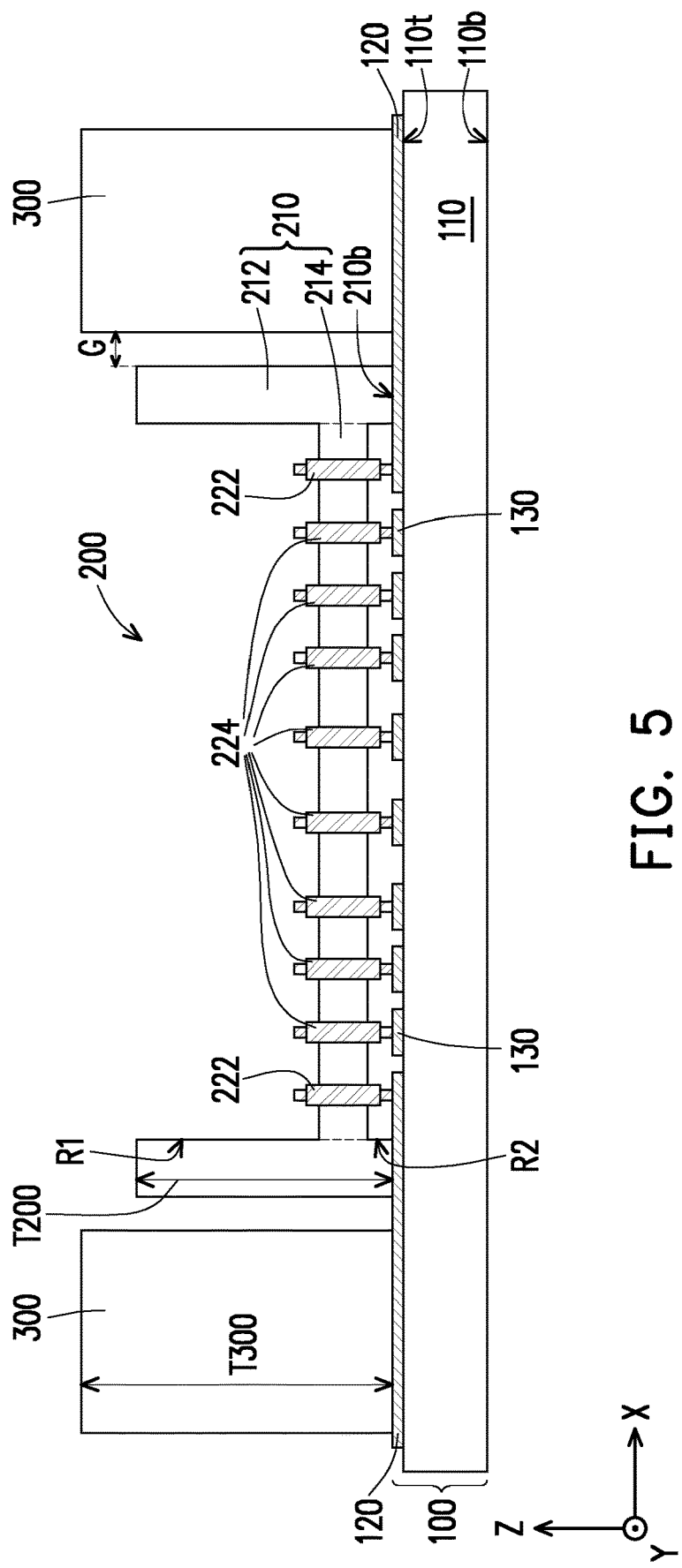

Referring to FIG. 5 and FIG. 6 together, in some embodiments, a heat dissipating element is mounted over the circuit carrier 110, in accordance with step S40 of FIG. 18. The heat dissipating element may include one or more than one heat dissipating element 300. For example, as shown in FIG. 6, the heat dissipating element includes a plurality of heat dissipating elements 300, such as a heat dissipating element 300$a$, a heat dissipating element 300$b$, a heat dissipating element 300$c$ and a heat dissipating element 300$d$. The heat dissipating elements 300 are disposed on the circuit board 100 and surround the socket 200, in some embodiments. For example, a thickness T300 of the heat dissipating elements 300 is greater than a thickness T200 of the socket 200. As shown in FIG. 6, only four heat dissipating elements 300 (e.g., 300a through 300d) are presented for illustrative purposes, however, it should be noted that the number of the heat dissipating elements 300 may be one or more than one, the disclosure is not limited thereto.

The heat dissipating elements 300 may be bonded to the conductive pattern 120 by placing the heat dissipating elements 300 on the conductive pattern 120 to establish a proper physical contact therebetween, thereby thermally coupling the heat dissipating elements 300 and the conductive pattern 120. In some embodiments, the heat dissipating elements 300 are removably installed (or bonded) on the conductive pattern 120 for thermally coupling the heat dissipating elements 300 and the conductive pattern 120 to achieve a thermal bonding therebetween. For example, the heat dissipating element 300a is bonded to and thermally coupled to the sub-pattern 120a, the heat dissipating element 300b is bonded to and thermally coupled to the sub-pattern 120b, the heat dissipating element 300c is bonded to and thermally coupled to the sub-pattern 120c, and the heat dissipating element 300d is bonded to and thermally coupled to the sub-pattern 120d, as shown in FIG. 6. In some embodiments, positioning locations of the heat dissipating elements 300 are within a positioning location of the conductive pattern 120 in a vertical projection on the circuit board 100 along the direction Z. For example, through the conductive pattern 120, the heat dissipating elements 300 and the circuit carrier 110 are spacing apart and physically separated from one another. In alternative embodiments, the heat dissipating elements 300 may be further electrically connected to the conductive pattern 120.

As shown in FIG. 5, for example, the conductive pattern 120 is located under the socket 200 and the heat dissipating elements 300 and further extended from the socket 200 to the heat dissipating elements 300, where a heat dissipating path from the socket 200 (e.g., the conductive connectors 220) to the heat dissipating elements 300 through the circuit board 100 (e.g., the conductive pattern 120) is established. In the disclosure, the heat dissipating elements 300 may be referred to as a cooling module or a cooling system. The heat dissipating elements 300, for example, each include a metal plate with fins, a metal plate with a conduit therein for conducting a coolant (such as water, oil, or cool air), or the like.

Figure 11:
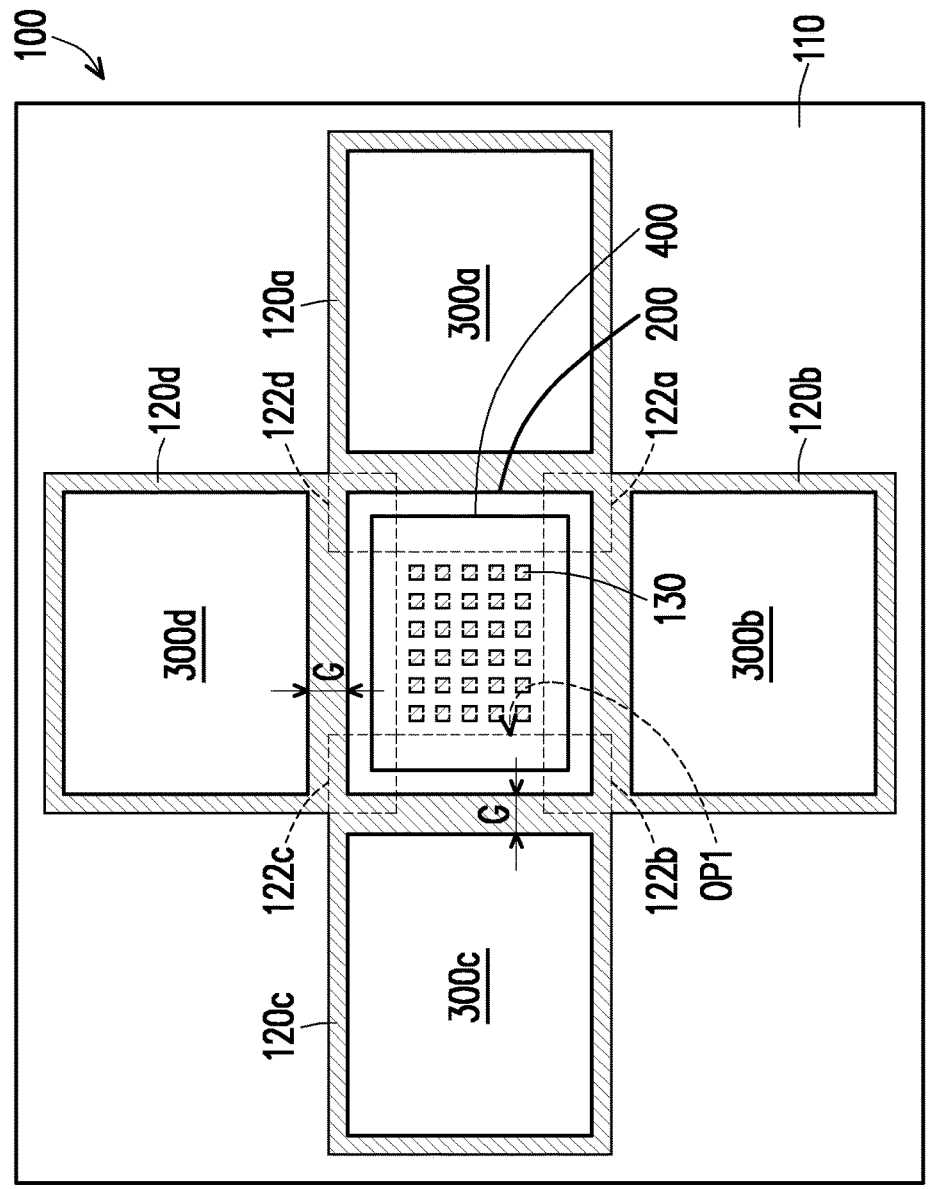
FIG. 11 is a schematic top view illustrating a relative position of components included in a semiconductor package assembly in accordance with other embodiments of the disclosure.

In some embodiments, each of the heat dissipating elements 300 are distant from the socket 200 by a gap G, as shown in FIG. 5 and FIG. 6. For example, the gap G is greater than or substantially equal to about 1 mm. The heat dissipating elements 300 may be different in the plane view projecting in the direction Z, in part or all. For example, as shown in FIG. 6, the sizes and shapes of the heat dissipating elements 300a and 300c are substantially identical (e.g., rectangular/square shapes), the sizes and shapes of the heat dissipating elements 300b and 300d are substantially identical (e.g., strip-shapes), and the sizes and shapes of the heat dissipating elements 300a and 300c are different from the sizes and shapes of the heat dissipating elements 300b and 300d. Alternatively, the sizes and shapes of the heat dissipating elements 300a, 300b, 300c and 300d in the plane view may be substantially the same (rectangular/square shape as depicted in FIG. 11 and strip-shape as depicted in FIG. 12).

However, the disclosure is not limited thereto. In other embodiments, the heat dissipating element includes only one heat dissipating element 300' having a frame shape (FIG. 13), where the frame shape includes a square annulus or a rectangle annulus having the opening at the center thereof, and the socket 200 is disposed inside the opening on the circuit board 100 and is separated from the heat dissipating element 300' by the gap G. In addition, the opening may be a rectangular shape, a square-shape, a circular shape or an elliptical shape. In addition, there may be one or more than on heat dissipating element 300 being bonded to one conductive pattern 120, depending on the design requirement.

Figure 8:
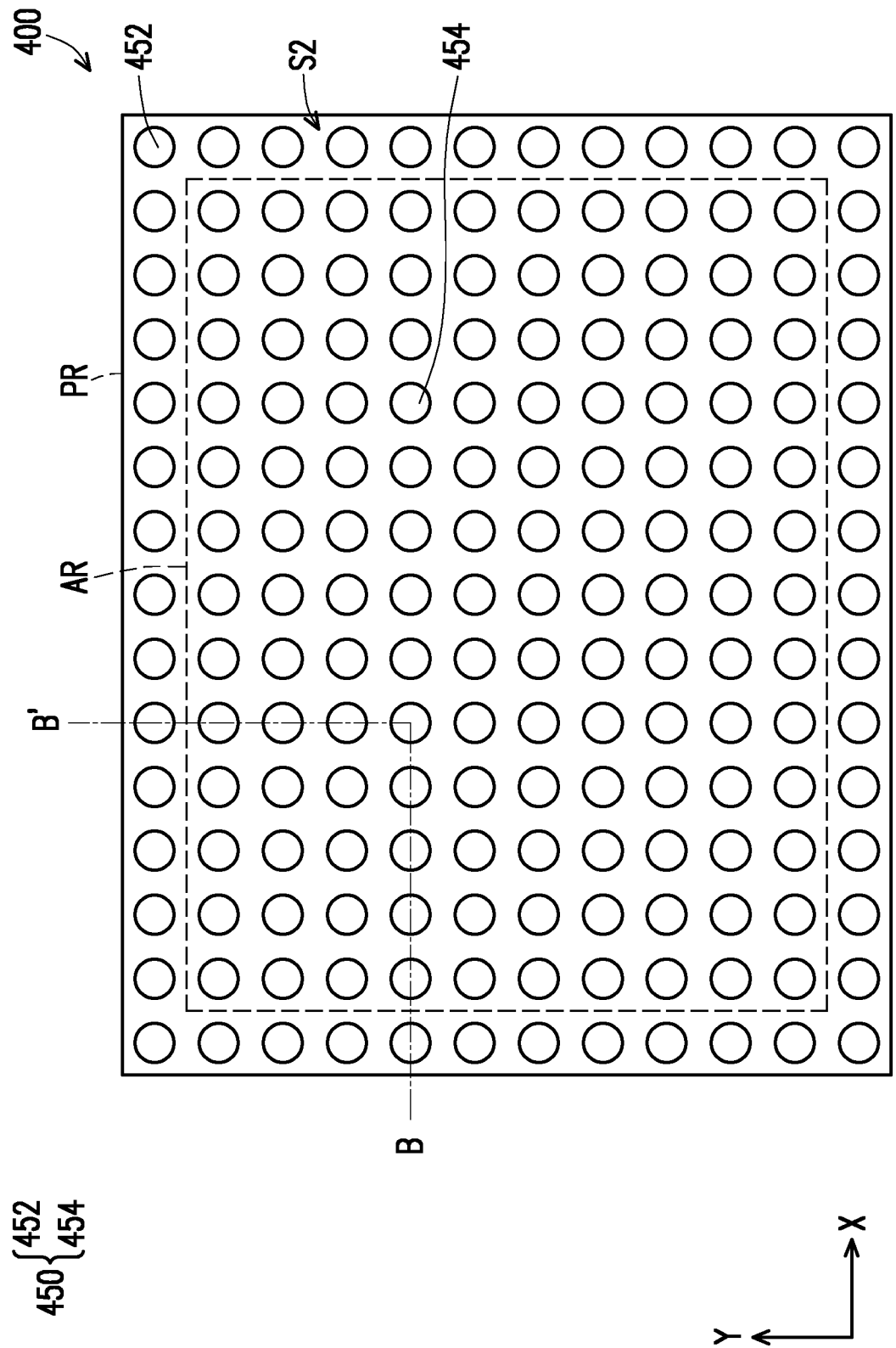

Referring to FIG. 7 and FIG. 8 together, in some embodiments, the semiconductor package 400 is provided, in accordance with step S50 of FIG. 18. For example, the semiconductor package 400 includes a plurality of semiconductor dies 410, a plurality of input/output (I/O) interface dies 420, an insulating encapsulation 430, a redistribution circuit structure 440 and a plurality of conductive elements 450, as shown in FIG. 7. In some embodiments, the conductive elements 450 are the interfaces for external connections to the semiconductor package 400. That is, the conductive elements 450 serve as the conductive terminals of the semiconductor package 400 to electrical connect with the external devices/apparatus (e.g., the socket 200 (via the conductive connectors 220)) for transmitting (outputting and/or inputting) electric signals, power signals, or ground signals. In alternative embodiments, a semiconductor device (now shown) is optionally bonded to the semiconductor package 400 in a manner similar to the conductive elements 450. The semiconductor device may be an integrated passive element (IPD) or a surface mount device (SMD), the disclosure is not limited thereto.

In some embodiments, if considering a top view on the X-Y plane along the direction Z, the semiconductor package 400 is in a form of chip-size being greater than or substantially equal to 1000 mm$^2$. Alternatively, the semiconductor package 400 may be in a wafer or panel form. In other words, the semiconductor package 400 is processed in the form of a reconstructed wafer/panel. In alternative embodiments, if considering a top view on the X-Y plane along the direction Z, the semiconductor package 400 is in a form of wafer-size having a diameter of about 4 inches or more. In further alternative embodiments, the semiconductor package 400 is in a form of wafer-size having a diameter of about 6 inches or more. In yet further alternative embodiments, the semiconductor package 400 is in a form of wafer-size having a diameter of about 8 inches or more. Or alternatively, the semiconductor package 400 is in a form of wafer-size having a diameter of about 12 inches or more. In some embodiments, a size of the conductive pattern 120 is greater than or substantially equal to a size of the semiconductor package 400 in the vertical projection on the circuit board 100 along the direction Z (e.g. on the X-Y plane).

The semiconductor dies 410 and the I/O interface dies 420 may be arranged aside to each other along the direction X and/or the direction Y. In some embodiments, the semiconductor dies 410 are arranged in the form of a matrix, such as a N'×N' array or a N'×M' array (N', M'>0, N' may or may not be equal to M'), while the I/O interface dies 420 are arranged to surround the semiconductor dies 410 (arranged into the array/matrix) for providing additional input/output circuitries thereto, and thus more I/O counts are provided to the semiconductor dies 410. The matrix of the I/O interface dies 420 may be a N"×N" array or a N"×M" array (N", M">0, N" may or may not be equal to M"). That is, in such embodiments, the I/O interface dies 420 are arranged into a matrix surrounding the perimeter of the matrix of the semiconductor dies 410.

However, the disclosure is not limited thereto, in an alternative embodiment, the semiconductor dies 410 and the I/O interface dies 420 are arranged in the form of a matrix, such as the Na×Na array or Na×Ma array (Na, Ma>0, Na may or may not be equal to Ma). With such embodiments, the semiconductor dies 410 and the I/O interface dies 420 are arranged into the matrix in an alternation manner. In a further alternative embodiment, the semiconductor dies 410 are arranged in the form of a first matrix and the I/O interface dies 420 are arranged in the form of a second matrix, where the first and second matrices are Nb×Nb array or Nb×Mb array (Nb, Mb>0, Nb may or may not be equal to Mb), and the first and second matrices are positioned next to each other along the direction X or the direction Y.

In some embodiments, the semiconductor dies 410 have a plurality of conductive vias 412, where the conductive vias 412 serve as conductive terminals of the semiconductor dies 410 for electrical connection to other devices/elements (e.g., the redistribution circuit structure 440. The semiconductor dies 410 each described herein may be referred to as a semiconductor chip or an integrated circuit (IC). For example, the semiconductor dies 410, independently, are a logic chip, such as a central processing unit (CPU), graphics processing unit (GPU), system-on-chip (SoC), system-on-integrated-circuit (SoIC), microcontroller, or the like. However, the disclosure is not limited thereto; in alternative embodiments, the semiconductor dies 410, independently, are a digital chip, analog chip or mixed signal chip, such as an application-specific integrated circuit (ASIC) chip, a sensor chips, a wireless and radio frequency (RF) chip, a baseband (BB) chip, a memory chip (such as high bandwidth memory (HBM) dies) or a voltage regulator chip. In further alternative embodiments, the semiconductor dies 410, independently, are referred to as a chip or an IC of combination-type, such as a WiFi chip simultaneously including both of a RF chip and a digital chip. In some embodiments, a type of a first group of the semiconductor dies 410 are different from a type of a second group of the semiconductor dies 410. In other words, the semiconductor dies 410 may include semiconductor chips or ICs of different types and/or the same type; the disclosure is not limited thereto. For example, the first group of the semiconductor dies 410 includes logic dies, while the second group of the semiconductor dies 410 includes memory dies.

In some embodiments, the I/O interface dies 420, independently, have a plurality of conductive vias 422, where the conductive vias 422 serve as conductive terminals of the I/O interface dies 420 for electrical connection to other devices/elements (e.g., the redistribution circuit structure 440. As shown in FIG. 7, only two semiconductor dies 410 and two I/O interface dies 420 are presented for illustrative purposes, however, it should be noted that the number of the semiconductor dies 410 and the number of the I/O interface dies 420 may be one or more than one, the disclosure is not limited thereto.

In some embodiments, the semiconductor dies 410 and the I/O interface dies 420 are encapsulated in the insulating encapsulation 430. For example, the insulating encapsulation 430 laterally wraps around the semiconductor dies 410 and the I/O interface dies 420, where the conductive vias 412 of the semiconductor dies 410 and the conductive vias 422 of the I/O interface dies 420 are accessibly exposed by the insulating encapsulation 430. As shown in FIG. 7, illustrated bottom surfaces of the conductive vias 412 and the conductive vias 422 are substantially leveled with an illustrated bottom surface of the insulating encapsulation 430. That is, in some embodiments, the illustrated bottom surfaces of the conductive vias 412, the surfaces of the conductive vias 422 and the bottom surface of the insulating encapsulation 430 are substantially coplanar to each other for achieving a high degree of coplanarity to facilitate the formation of a later-formed element (e.g., the redistribution circuit structure 440). It is appreciated that the illustrated bottom surfaces of the conductive vias 412 and the conductive vias 422 depicted in FIG. 7 are equivalent to active sides of the semiconductor dies 410 and the I/O interface dies 420, respectively.

In some embodiments, a sidewall of each conductive via 412 of the semiconductor dies 410 is partially covered (e.g. in physical contact with) by the insulating encapsulation 430. In some embodiments, a sidewall of each conductive via 422 of the I/O interface dies 420 is partially covered (e.g. in physical contact with) by the insulating encapsulation 430. However, the disclosure is not limited thereto; alternatively, the sidewall of each conductive via 412 and the sidewall of each conductive via 422 are free from the insulating encapsulation 430. In further alternative embodiments, the sidewall of each conductive via 412 of the semiconductor dies 410 is partially covered (e.g. in physical contact with) by the insulating encapsulation 430, while the sidewall of each conductive via 422 of the I/O interface dies 420 is not covered by the insulating encapsulation 430. In yet further alternative embodiments, the sidewall of each conductive via 412 of the semiconductor dies 410 is not covered by the insulating encapsulation 430, while the sidewall of each conductive via 422 of the I/O interface dies 420 is partially covered (e.g. in physical contact with) by the insulating encapsulation 430.

On the other hand, as shown in FIG. 7, illustrated top surfaces (e.g., non-active sides) of the semiconductor dies 410 and the I/O interface dies 420 may be substantially leveled with an illustrated top surface of the insulating encapsulation 430. For example, the illustrated top surfaces of the semiconductor dies 410 and the I/O interface dies 420 are substantially coplanar to the illustrated top surface of the insulating encapsulation 430.

The insulating encapsulation 430 may include an acceptable insulating encapsulation material. The insulating encapsulation 430, for example, includes polymers (such as epoxy resins, phenolic resins, silicon-containing resins, or other suitable resins), dielectric materials, or other suitable materials. The insulating encapsulation 430 may be a molding compound formed by a molding process. The insulating encapsulation 430 may further include inorganic filler or inorganic compound (e.g. silica, clay, and so on) which can be added therein to optimize coefficient of thermal expansion (CTE) of the insulating encapsulation 430. The disclosure is not limited thereto.

In some embodiments, the redistribution circuit structure 440 is located over the semiconductor dies 410, the I/O interface dies 420 and the insulating encapsulation 430. As shown in FIG. 7, the redistribution circuit structure 440, for example, includes a fine-featured portion 440A and a coarse-featured portion 440B, and is electrically connected to the semiconductor dies 410 and the I/O interface dies 420 through connecting to the conductive vias 412 of the semiconductor dies 410 and the conductive vias 422 of the I/O interface dies 420 exposed by the insulating encapsulation 430. In some embodiments, the fine-featured portion 440A is located between the coarse-featured portion 440B and the semiconductor dies 410 and between the coarse-featured portion 440B and the I/O interface dies 420. In some embodiments, the fine-featured portion 440A of the redistribution circuit structure 440 is formed over and electrically coupled to the semiconductor dies 410 and the I/O interface dies 420, and the coarse-featured portion 440B is electrically coupled to the semiconductor dies 410 and the I/O interface dies 420 through the fine-featured portion 440A. For example, as shown in FIG. 7, the fine-featured portion 440A is capable of providing local electrical communications between the semiconductor dies 410, between the I/O interface dies 420 and between the semiconductor dies 410 and the I/O interface dies 420, while the coarse-featured portion 440B is capable of providing global electrical communications between external devices/apparatus electrically connected to the conductive elements 450 and the semiconductor dies 410 and/or the I/O interface dies 420.

For example, the fine-featured portion 440A includes a dielectric structure 442A and a metallization pattern 444A located in the dielectric structure 442A, and the coarse-featured portion 440B includes a dielectric structure 442B and a metallization pattern 444B located in the dielectric structure 442B. The metallization patterns 444A and the metallization patterns 444B independently may include one or more patterned conductive layers (which being individually referred to as redistribution layers), while the dielectric structures 442A and the dielectric structures 442B independently may include one or more dielectric layers arranged alternatively with the patterned conductive layers. For example, the one or more patterned conductive layers, which are electrically connected to each other, includes line portions (also referred to as conductive lines or traces) extending on the X-Y plane and via portions (also referred to as conductive vias) extending on the direction Z and electrically connected to the line portions (together referred to as an internal routing circuit) for providing routing functionality. In addition, the one or more patterned conductive layers further include plane portions extending on the X-Y plane and other via portions extending on the direction Z electrically connected to the plane portions (together referred to as a ground plate or ground plane) for being electrically grounded. In such case, the plane portions are electrically isolated from the rest of the metallization pattern 444A and the rest of the metallization pattern 444B. For example, one line portion and one plane portion located in the same patterned conductive layer in either the fine-featured portion 440A or the coarse-featured portion 440B are electrically isolated from one another through a slit, where the slit is filled with the dielectric material made for the dielectric structure 442A or 442B. The number of the dielectric layers included in one dielectric structure 442A or 442B and the number of the patterned conductive layers included in one metallization pattern 444A or 444B may not be limited to the drawings of the disclosure, and may be selected and designated based on the demand and design requirements.

The fine-featured portion 440A and the coarse-featured portion 440B of the redistribution circuit structure 440 include metallization patterns and dielectric structures of differing sizes, as shown in FIG. 7, for example. In certain embodiments, the patterned conductive layers included in the metallization pattern 444A are formed from a same conductive material, and are formed to a same thickness (e.g., a first thickness) and a same line width (e.g., a first line width), and the patterned conductive layers included in the metallization pattern 444B are formed from a same conductive material, and are formed to a same thickness (e.g., a second thickness) and a same line width (e.g., a second line width). Likewise, in some embodiments, the dielectric layers included in the dielectric structure 442A are formed from a same dielectric material and are formed to a same thickness, and the dielectric layers included in the dielectric structure 442B are formed from a same dielectric material and are formed to a same thickness. In some embodiments, along the direction Z, the patterned conductive layers included in the metallization pattern 444A have the first thickness that is smaller than the second thickness of the patterned conductive layers included in the metallization pattern 444B. On the other hand, on the top view (e.g., on the X-Y plane), the patterned conductive layers included in the metallization pattern 444A have the first line width that is smaller than the second line width of the patterned conductive layers included in the metallization pattern 444B.

The material of the dielectric structures 442A, 442B may include polyimide, epoxy resin, acrylic resin, phenol resin, benzocyclobutene (BCB), polybenzoxazole (PBO), or any other suitable polymer-based dielectric material, and may be formed by deposition, lamination or spin-coating. The material of the metallization patterns 444A, 444B may include aluminum, titanium, copper, nickel, tungsten, and/or alloys thereof, and may be formed by electroplating or deposition. The disclosure is not limited thereto. The dielectric structures 442A, 442B and the metallization patterns 444A, 444B independently may also be patterned by a photolithography and etching process.

The material of the dielectric structure 442A is, for example, as the same as the material of the dielectric structure 442B. For another example, the materials of the dielectric structures 442A and 442B are different from one another. The material of the metallization pattern 444A is, for example, as the same as the material of the metallization pattern 444B. For another example, the materials of the metallization patterns 444A and 444B are different from one another. The disclosure is not limited thereto. In alternative embodiments, the redistribution circuit structure 440 may include metallization patterns of same size and dielectric structures of same size.

In some embodiments, the conductive elements 450 are attached to the redistribution circuit structure 440 for electrically coupling therebetween, as shown in FIG. 7. The conductive elements 450 may include a plurality of conductive elements 452 and a plurality of conductive elements 454 surrounded by the conductive elements 452. For example, as shown in FIG. 7 and FIG. 8, the semiconductor package 400 has an illustrated top surface S1 and an illustrated bottom surface S2 opposite to the illustrated top surface S1 in the direction Z, where the illustrated bottom surface S2 includes an active region AR and a periphery region PR surrounding the active region AR. As shown in FIG. 8, the conductive elements 452 may be disposed within the periphery region PR of the semiconductor package 400, and the conductive elements 454 may be disposed within the active region AR of the semiconductor package 400. In some embodiments, the conductive elements 452 within the periphery region PR are electrically connected to the ground plate included in the redistribution circuit structure 440, and the conductive elements 454 within the active region AR are electrically connected to the internal routing circuit include in the redistribution circuit structure 440. For example, through the redistribution circuit structure 440, some of the conductive elements 452 are electrically connected to the semiconductor dies 410, and some of the conductive elements 452 are electrically connected to the I/O interface dies 420. On the other hand, for example, through the redistribution circuit structure 440, some of the conductive elements 454 are electrically connected to the semiconductor dies 410, and some of the conductive elements 454 are electrically connected to the I/O interface dies 420. Besides, some of the conductive elements 454 may be electrically floated or grounded, the disclosure is not limited thereto. The number of the conductive elements 450 (e.g. 452/454) is not limited to the drawings of the disclosure, and may be selected and designed based on the demand. In some embodiments, a ratio of the number of the conductive elements 452 to the number of the conductive elements 454 is from about 5:5 to about 3:7.

The conductive elements 450 may be disposed on the redistribution circuit structure 440 by ball placement process or reflow process. The conductive elements 450 are, for example, solder balls or ball grid array (BGA) balls or bumps. Alternatively, the conductive elements 450 may include micro-bumps, metal pillars, electroless nickel-electroless palladium-immersion gold (ENEPIG) formed bumps, controlled collapse chip connection (C4) bumps, or the like; and may be formed by plating. The conductive elements 450 may be solder free. In the alternative embodiments of which the semiconductor device(s) is included, the semiconductor device may be disposed on the redistribution circuit structure 440 by flip-chip bonding technology or surface device mounting technology.

The conductive elements 452 may be periodically arranged into a first array within the periphery region PR, and the conductive elements 454 may be periodically arranged in to a second array within the active region AR, where the first array me be different from the second array. For example, the positions of the conductive elements 452 and 454 are respectively corresponding to the positions of the conductive connectors 222 and 224, as shown in FIG. 8.

In some alternative embodiments (not shown), before disposing/forming the conductive elements 450 on the redistribution circuit structure 440, a plurality of under-ball metallurgy (UBM) patterns are optionally formed on and electrically coupled to the redistribution circuit structure 440, where the strength of connection between the conductive elements 450 and the redistribution circuit structure 440 is enhanced. The conductive elements 450 may be placed on the UBM patterns through ball placement process. That is, the conductive elements 450 may be electrically coupled to the redistribution circuit structure 440 through the UBM patterns. In some embodiments, the UBM patterns are made of a metal layer including a single layer or a metallization layer including a composite layer with a plurality of sub-layers formed of different materials. In some embodiments, the UBM patterns include copper, nickel, molybdenum, titanium, tungsten, titanium nitride, titanium tungsten, combinations thereof, or the like. For example, the UBM patterns include a titanium layer and a copper layer over the titanium layer. The UBM patterns may be formed using, for example, electroplating, sputtering, physical vapor deposition (PVD), or the like. However, the UBM patterns may be omitted from the redistribution circuit structure 440, the disclosure is not limited thereto.

Figure 9:
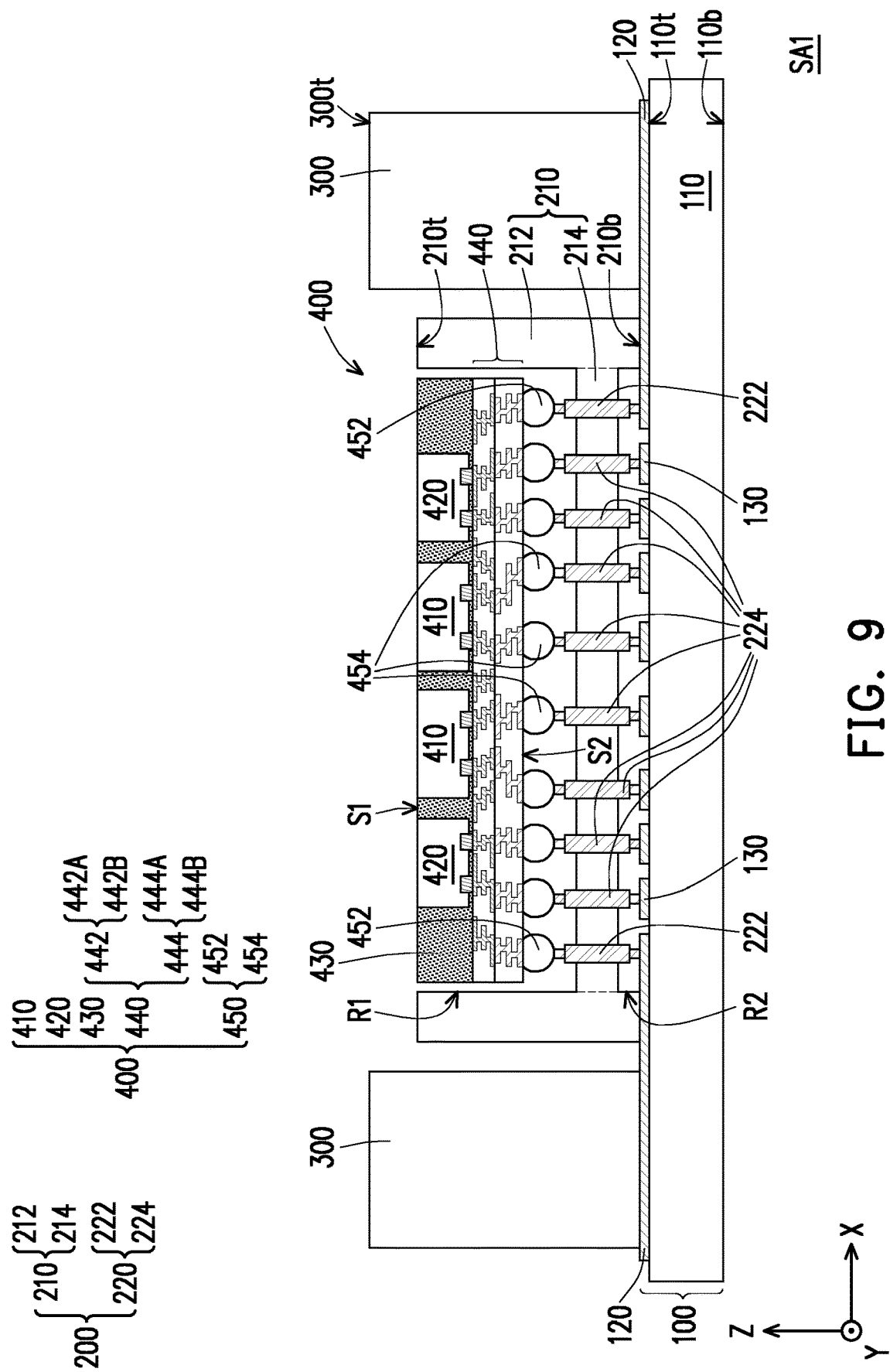
Figure 10:
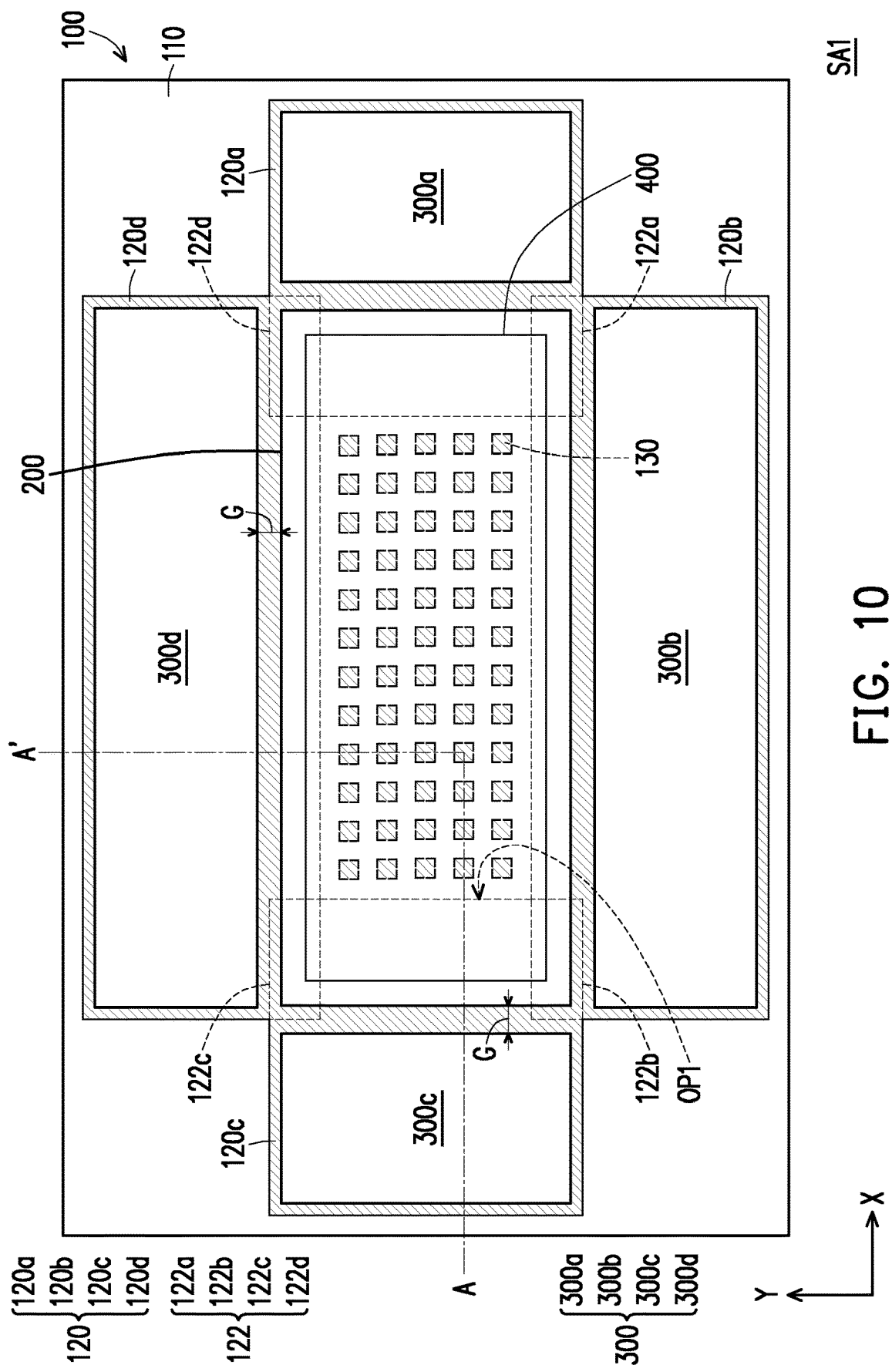

Referring to FIG. 9 and FIG. 10 together, in some embodiments, the semiconductor package 400 is placed onto the socket 200 to connect the semiconductor package 400 and the socket 200, in accordance with step S60 of FIG. 18. In some embodiments, the semiconductor package 400 is mounted into the recess R1, where the conductive elements 450 of the semiconductor package 400 are in contact with (e.g. a removably bonding, such as Ohmic contact) the conductive connector 220 of the socket 200. For example, as shown in FIG. 9, the conductive elements 452 are in physical contact with the end portions 222a of the conductive connectors 222, and the conductive elements 454 are in physical contact with the end portions 224a of the conductive connectors 224, thereby the semiconductor package 400 is electrically connected to and thermally coupled to the socket 200. That is, through the socket 200, the semiconductor package 400 is electrically connected to and thermally coupled to both of the heat dissipating elements 300 and the circuit board 100. Up to here, the semiconductor package assembly SA1 is manufactured.

One or more than one semiconductor package assembly SA1 may act as a high performance computing (HPC) system. If considering multiple semiconductor package assemblies SA1 together acting as the high performance computing (HPC) system, the semiconductor package assemblies SA1 may each be used as an electronics card inserting an end having a plurality of electrical connectors (e.g. the first or second contact pads located on the circuit board 100 and being free from the conductive pattern 120 and the conductive contacts 130) into a slot of a rack, with these electrical connectors contacting the electrical connectors of the rack. In other words, the semiconductor package assemblies SA1 are electrically connected and electrically communicated to one another through the rack.

In some embodiments, through the socket 200, the ground plate included in the redistribution circuit structure 440 of the semiconductor package 400 is thermally coupled to the heat dissipating elements 300. Owing to such configuration, the heat generated from the semiconductor package 400 is dissipated to the heat dissipating elements 300 through the socket 200 and the conductive pattern 120 of the circuit board 100, thereby the heat dissipation of the semiconductor package 400 is greatly enhanced, the reliability of the semiconductor package 400 is improved. In other words, a better cooling efficiency of the semiconductor package assembly SA1 is achieved. On the other hand, in some embodiments, through the socket 200, the internal routing circuit included in the redistribution circuit structure 440 of the semiconductor package 400 is electrically coupled to the circuit board 100. Owing to such configuration, the electric signals, power signals or ground signals are transmitted to the semiconductor package 400 from the circuit board 100 or transmitted from the semiconductor package 400 to the circuit board 100 through the sockets 200 and the conductive contacts 130 of the circuit board 100. The performance of the semiconductor package assembly SA1 is ensured.

As illustrated in FIG. 9, for example, in the semiconductor package assembly SA1, the illustrated top surface S1 of the semiconductor package 400 after mounting to the socket 200 is substantially coplanar to a top surface 210t of the socket 200. However, the disclosure is not limited thereto; alternatively, the illustrated top surface S1 of the semiconductor package 400 may be lower or above the top surface 210t of the socket 200. On the other hand, the illustrated top surface S1 of the semiconductor package 400 is lower than top surfaces 300t of the heat dissipating elements 300, in some embodiments. That is, for example, as shown in FIG. 9, a distance between the illustrated top surface S1 of the semiconductor package 400 and the surface 110t of the circuit carrier 110 is less than a distance between the top surfaces 300t of the heat dissipating elements 300 and the surface 110t of the circuit carrier 110. Owing to the height-level difference between the heat dissipating elements 300 and the semiconductor package 400, cooling capability is increase, thereby improving the heat dissipating efficiency.

Figure 15:
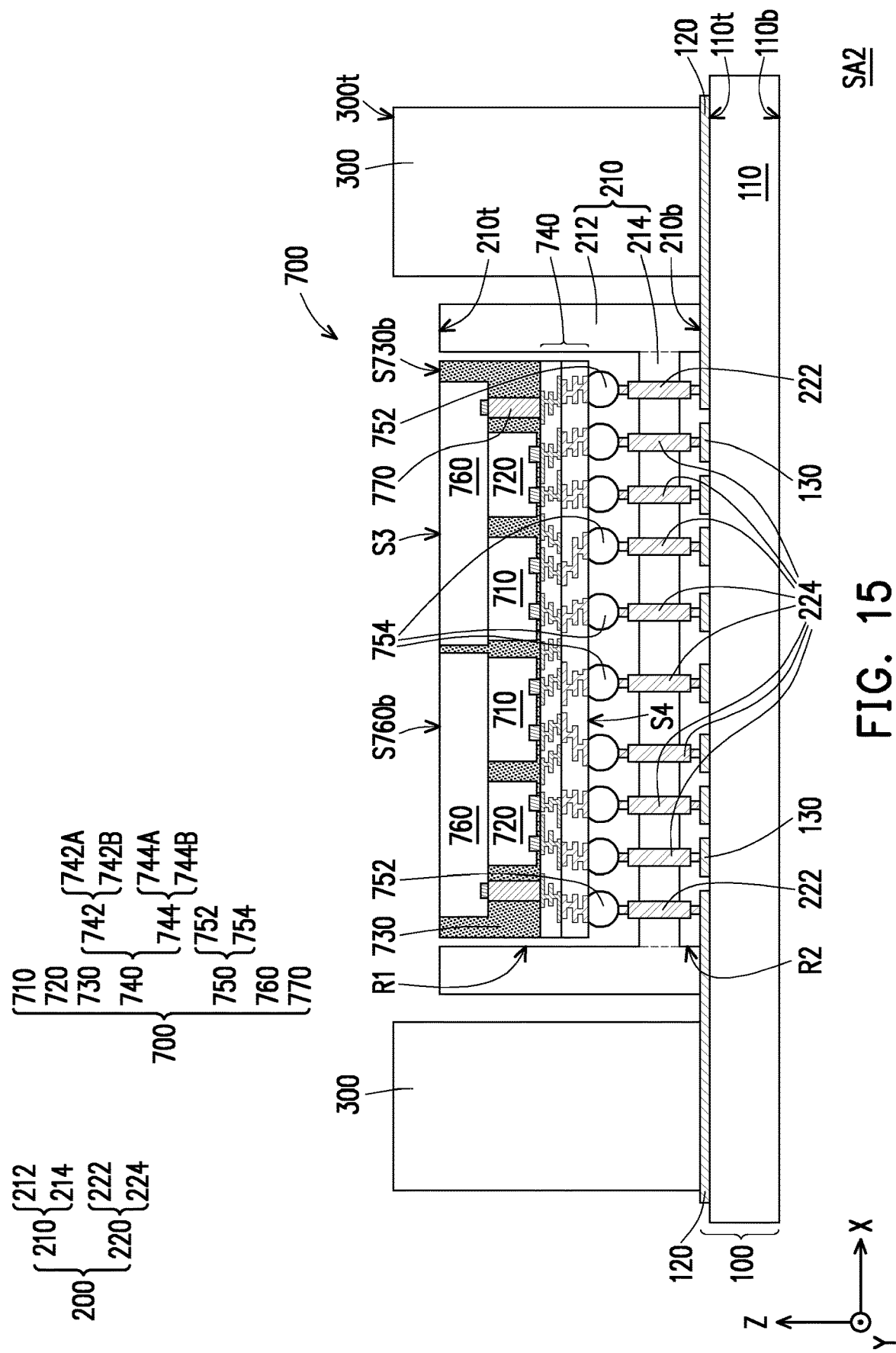
FIG. 15 is a schematic cross-sectional views showing a semiconductor package assembly in accordance with alternative embodiments of the disclosure.

In the disclosure, the semiconductor dies of a semiconductor package may be arranged into a stacking configuration (e.g., an arrangement of multiple tiers each having semiconductor dies) in a semiconductor package assembly of the disclosure. For example, the semiconductor package 400 may be substituted by a semiconductor package 700 as depicted in FIG. 15. FIG. 15 is a schematic cross-sectional views showing the semiconductor package assembly SA2 in accordance with alternative embodiments of the disclosure. The elements similar to or substantially the same as the elements described above will use the same reference numbers, and certain details or descriptions of the same elements (e.g. the formations and materials) and the relationship thereof (e.g. the relative positioning configuration and connection) will not be repeated herein.

As illustrated in FIG. 15, the semiconductor package 700 is mounted into the recess R1 of the socket 200 to connect the semiconductor package 700 and the socket 200 so as to form the semiconductor package assembly SA2. In some embodiments, the semiconductor package 700 includes a plurality of semiconductor dies 710, a plurality of input/output (I/O) interface dies 720, an insulating encapsulation 730, a redistribution circuit structure 740 (including a fine-featured portion 740A (with 742A and 744A) and a coarse-featured portion 740B (with 742B and 744B)), a plurality of conductive elements 750 (including 752 and 754), a plurality of semiconductor dies 760 and a plurality of conductive pillars 770, as shown in FIG. 15. The formation and material of each of the semiconductor dies 710, the I/O interface dies 720, the insulating encapsulation 730, the redistribution circuit structure 740 and the conductive elements 750 are similar to or substantially identical to the formation and material of each of the semiconductor dies 410, the I/O interface dies 420, the insulating encapsulation 430, the redistribution circuit structure 440 and the conductive elements 450 as described in FIG. 7 and FIG. 8, and thus are omitted herein for brevity. In some embodiments, the formation, material and type of each of the semiconductor dies 760 may be, independently, similar or identical to the semiconductor dies 410 or the I/O interface dies 420 as described in FIG. 7 and FIG. 8, and thus are omitted herein.

As shown in FIG. 15, the semiconductor dies 710 and the I/O interface dies 720 are sandwiched between the semiconductors dies 760 and the redistribution circuit structure 740, where the semiconductor dies 710, the I/O interface dies 720 and the semiconductors dies 760 are encapsulated in the insulating encapsulation 730, for example. In other words, the semiconductors dies 760 are stacked on the semiconductor dies 710 and the I/O interface dies 720, or vice versa. There are only two tiers of the semiconductor dies as shown in FIG. 15, however, the disclosure is not limited thereto. The number of the tiers of the semiconductor dies may be one, two or more than two based on the demand and design layout. As shown in FIG. 15, surfaces S760b of the semiconductor dies 760 are substantially coplanar to and leveled with the surface S730b of the insulating encapsulation 730, for example. In other words, the surfaces S760b of the semiconductor dies 760 are exposed by the insulating encapsulation 730.

In some embodiments, the semiconductor package 700 has an illustrated top surface S3 and an illustrated bottom surface S4 opposite to the illustrated top surface S3 in the direction Z, where the illustrated bottom surface S4 includes an active region AR and a periphery region PR surrounding the active region AR. As illustrated in FIG. 15, for example, in the semiconductor package assembly SA2, the illustrated top surface S3 of the semiconductor package 700 after mounting to the socket 200 is substantially coplanar to a top surface 210t of the socket 200. However, the disclosure is not limited thereto; alternatively, the illustrated top surface S3 of the semiconductor package 700 may be lower or above the top surface 210t of the socket 200. On the other hand, the illustrated top surface S3 of the semiconductor package 700 is lower than top surfaces 300t of the heat dissipating elements 300, in some embodiments. That is, for example, as shown in FIG. 15, a distance between the illustrated top surface S3 of the semiconductor package 700 and the surface 110t of the circuit carrier 110 is less than a distance between the top surfaces 300t of the heat dissipating elements 300 and the surface 110t of the circuit carrier 110. Owing to the height-level difference between the heat dissipating elements 300 and the semiconductor package 700, cooling capability is increase, thereby improving the heat dissipating efficiency.

In some embodiments, the redistribution circuit structure 740 is electrically connected to conductive vias 712 of the semiconductor dies 710 and conductive vias 722 of the I/O interface dies 720, and is further electrically connected to conductive vias 762 of the semiconductor dies 760 through conductive pillars 770. The conductive pillars 770 may be made of a metal material such as copper, copper alloys, or the like. As shown in FIG. 15, the conductive pillars 770 are located next to the semiconductor dies 710 and the I/O interface dies 720 and are encapsulated in the insulating encapsulation 730, for example. In some embodiments, the semiconductor dies 710, the I/O interface dies 720 and the semiconductors dies 760 are electrically connected to and thermally coupled to the redistribution circuit structure 740. For example, the conductive elements 752 of the conductive elements 750 within the periphery region PR are electrically connected to the ground plate included in the redistribution circuit structure 740, and the conductive elements 754 of the conductive elements 750 within the active region AR are electrically connected to the internal routing circuit include in the redistribution circuit structure 740.

In some embodiments, the conductive elements 750 of the semiconductor package 700 are in contact with (e.g. a removably bonding, such as Ohmic contact) the conductive connector 220 of the socket 200. For example, as shown in FIG. 15, the conductive elements 752 are in physical contact with the end portions 222a of the conductive connectors 222, and the conductive elements 754 are in physical contact with the end portions 224a of the conductive connectors 224, thereby the semiconductor package 700 is electrically connected to and thermally coupled to the socket 200. That is, through the socket 200, the semiconductor package 700 is electrically connected to and thermally coupled to both of the heat dissipating elements 300 and the circuit board 100.

In such case, the conductive connectors 222 of the socket 200 are electrically connected and thermally coupled to the conductive pattern 120 underlying thereto and are further electrically connected and thermally coupled to the conductive elements 752 of the conductive elements 750 overlying thereto. Owing to such configuration (e.g. due to thermal conduction), a heat dissipating path from the socket 200 (e.g., the conductive connectors 220) to the heat dissipating elements 300 through the circuit board 100 (e.g., the conductive pattern 120) is established, where the heat generated from the semiconductor package 700 is dissipated to the heat dissipating elements 300 through the socket 200 and the conductive pattern 120 of the circuit board 100, thereby the heat dissipation of the semiconductor package 700 is greatly enhanced, the reliability of the semiconductor package 700 is improved. In other words, a better cooling efficiency of the semiconductor package assembly SA2 is achieved. On the other hand, the conductive connectors 224 of the socket 200 are electrically connected to and thermally coupled to the conductive contacts 130 underlying thereto and are further electrically connected to and thermally coupled to the conductive elements 754 of the conductive elements 750 overlying thereto. Owing to such configuration (e.g. due to electrical conduction), the electric signals, power signals or ground signals are transmitted to the semiconductor package 700 from the circuit board 100 or transmitted from the semiconductor package 700 to the circuit board 100 through the sockets 200 and the conductive contacts 130 of the circuit board 100. The performance of the semiconductor package assembly SA2 is ensured.

Figure 16:
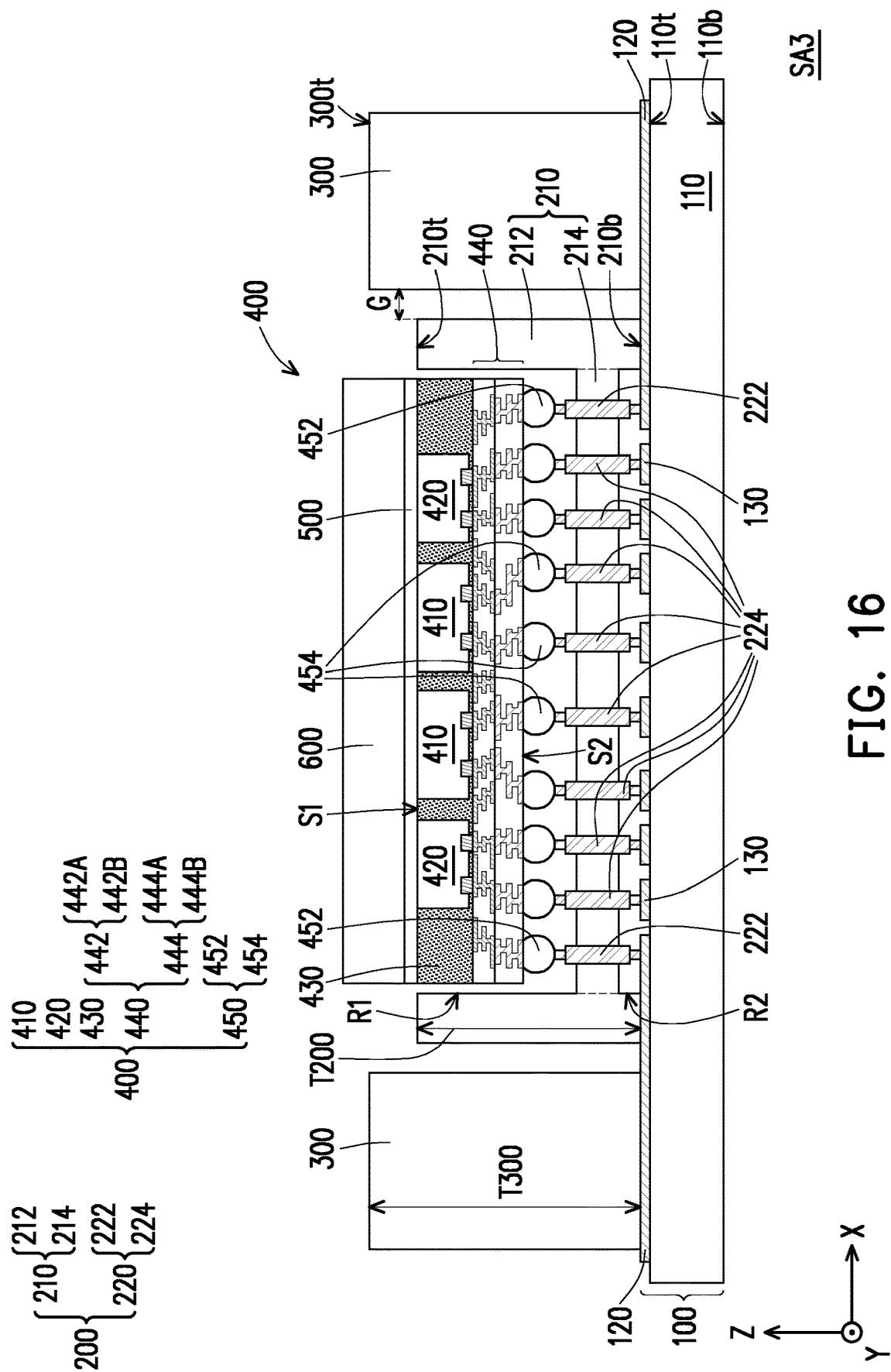
FIG. 16 is a schematic cross-sectional views showing a semiconductor package assembly in accordance with some embodiments of the disclosure.
Figure 17:
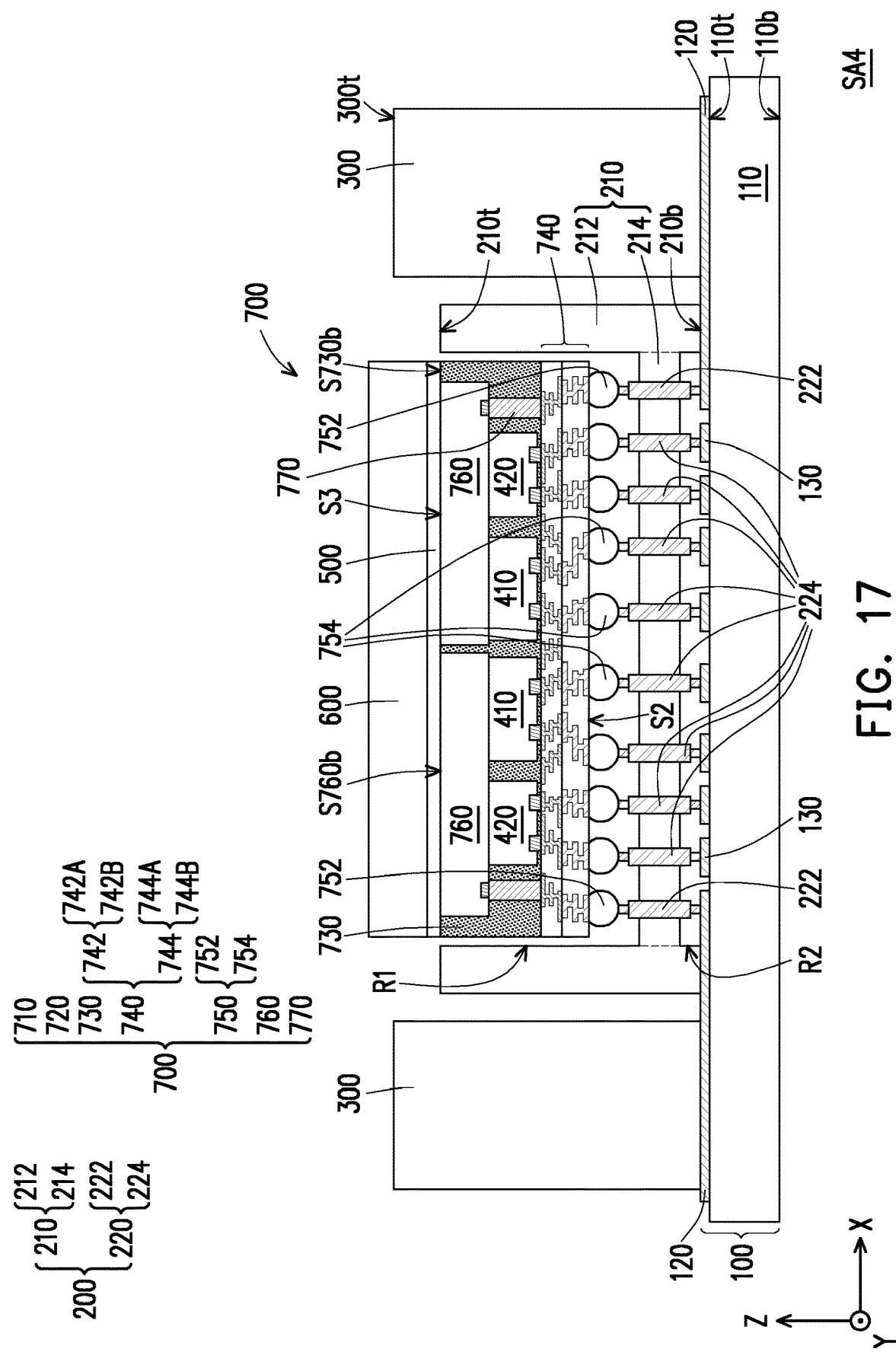
FIG. 17 is a schematic cross-sectional views showing a semiconductor package assembly in accordance with alternative embodiments of the disclosure.

In the disclosure, an additional heat dissipating element may be adopted in a semiconductor package assembly of the disclosure. For example, a heat dissipation lid 600 is mounted onto the semiconductor package 400 as illustrated in FIG. 16 or the semiconductor package 700 as illustrated in FIG. 17. FIG. 16 is a schematic cross-sectional views showing a semiconductor package assembly SA3 in accordance with some embodiments of the disclosure. FIG. 17 is a schematic cross-sectional views showing a semiconductor package assembly SA4 in accordance with alternative embodiments of the disclosure. The elements similar to or substantially the same as the elements described above will use the same reference numbers, and certain details or descriptions of the same elements (e.g. the formations and materials) and the relationship thereof (e.g. the relative positioning configuration and connection) will not be repeated herein.

Referring to FIG. 16, in some embodiments, a heat dissipation lid 600 is provided and bonded to the semiconductor package 400 to form the semiconductor package assembly SA3. For example, the heat dissipation lid 600 is attached to the illustrated top surface S1 of the semiconductor package 400 via a thermal interface material 500. In some embodiments, the thermal interface material 500 thermally couples the semiconductor package 400 and the heat dissipation lid 600. The thermal interface material 500 may comprise any suitable thermally conductive material, for example, a polymer having a good thermal conductivity, which may be between about 1 W/(m·K) to about 50 W/(m·K) or more. The heat dissipation lid 600 may have a high thermal conductivity, for example, between about 200 W/(m·K) to about 400 W/(m·K) or more, and may be formed in form of a block or a block with fins standing thereon, using a metal, a metal alloy, and the like. In some embodiments, the heat dissipation lid 600 may provide physical protection to the semiconductor package 400 in addition to the functionality of dissipating heat. The thermal interface material 500 is thermally coupled to the semiconductor dies 410 and the I/O interface dies 420, which further helps to dissipate heat from the semiconductor package 400 to the heat dissipation lid 600, and a heat dissipating efficiency of the semiconductor package assembly SA3 is further ensured.

In other embodiments, as shown in FIG. 17, the heat dissipation lid 600 is provided and bonded to the semiconductor package 700 to form the semiconductor package assembly SA4. For example, the heat dissipation lid 600 is attached to the illustrated top surface S3 of the semiconductor package 700 via the thermal interface material 500. In some embodiments, the thermal interface material 500 thermally couples the semiconductor package 700 and the heat dissipation lid 600. The heat dissipation lid 600 may provide physical protection to the semiconductor package 400 in addition to the functionality of dissipating heat. For example, the thermal interface material 500 is thermally coupled to the semiconductor dies 710, the I/O interface dies 720 and semiconductor dies 710, which further helps to dissipate heat from the semiconductor package 700 to the heat dissipation lid 600, and a heat dissipating efficiency of the semiconductor package assembly SA4 is further ensured.

Although there is only one semiconductor package 400 or 700 being mounted to one socket 200 in the semiconductor package assembly (e.g., SA1, SA2, SA3, or SA4) in the above embodiments, the number of the semiconductor package 400 or 700 mounted to the socket 200 is not limited thereto. For example, two or more than two semiconductor packages 400 and/or 700 may be mounted to a single one socket 200, where each of the two or more than two semiconductor packages 400 and/or 700 is, through the socket 200, at least thermally coupled to the heat dissipating elements 300 and electrically connected to the circuit board 100.

In alternative embodiments, two or more than two sockets 200 may be installed on a single circuit board 100 in the semiconductor package assembly (e.g., SA1, SA2, SA3, or SA4), where each socket 200 may be installed with one or more than one semiconductor package 400 and/or 700 and may be thermally coupled to heat dissipating elements 300 and electrically connected to the circuit board 100. For example, each socket 200 are surrounded by the heat dissipating elements 300 at a periphery thereof (e.g. four different sides) with a certain distance (e.g., the gap G), where the heat dissipating elements 300 can be shared by two adjacent sockets 200 or not shared among the sockets 200.

In accordance with some embodiments, a semiconductor package assembly includes a circuit board, a heat dissipating element and a semiconductor device. The circuit board includes a conductive pattern. The heat dissipating element is located on the circuit board, where the heat dissipating element is connected to the conductive pattern. The semiconductor device is located on the circuit board and next to the heat dissipating element, where the semiconductor device is thermally connected to the heat dissipating element through the conductive pattern.

In accordance with some embodiments, a semiconductor package assembly includes a circuit board, a plurality of cooling modules, a socket and a semiconductor package. The circuit board includes a conductive pattern and conductive contacts surrounded by the conductive pattern. The plurality of cooling modules stand on and are thermally coupled to the conductive pattern. The socket is located on the circuit board and connected to the conductive pattern and the conductive contacts, where the socket is surrounded by the plurality of cooling modules. The semiconductor package is located on and connected to the socket, where the semiconductor package is thermally connected to the heat dissipating element through the conductive pattern and the socket and is electrically connected to the circuit board through the conductive contacts and the socket.

In accordance with some embodiments, a method of manufacturing a semiconductor package assembly includes the following steps: providing a circuit board comprising a conductive pattern; mounting a heat dissipating element over the circuit board, the heat dissipating element being connected to the conductive pattern; and mounting a semiconductor device over the circuit board, the semiconductor device being located next to the heat dissipating element in a lateral direction, and the semiconductor device being thermally connected to the heat dissipating element through the conductive pattern.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor package assembly, comprising:
a circuit board having an outermost surface, comprising a conductive pattern distributed on the outermost surface, wherein the conductive pattern comprises a pre-determined pattern having an opening disposed therethrough;
a heat dissipating element, located on the outermost surface the circuit board, wherein the heat dissipating element is connected to the conductive pattern;
a semiconductor device, located on the circuit board and next to the heat dissipating element, the semiconductor device being thermally connected to the heat dissipating element through the conductive pattern, wherein in a vertical projection on the circuit board along a stacking direction of the semiconductor device and the circuit board, the semiconductor device covers the opening; and
a socket, located on the circuit board and next to the heat dissipating element, wherein the socket is located between and connected to the semiconductor device and the circuit board in the stacking direction,
wherein in the vertical projection, a projection of the semiconductor device is offset from a projection of the heat dissipating element.

2. The semiconductor package assembly of claim 1, wherein the socket is connected to the conductive pattern and conductive contacts of the circuit board, the semiconductor device is electrically connected to the circuit board through the socket and the conductive contacts and is thermally coupled to the heat dissipating element through the socket and the conductive pattern.

3. The semiconductor package assembly of claim 2, wherein the conductive pattern is located on a surface of the circuit board and under the socket and the heat dissipating element, and the conductive pattern extends from the socket to the heat dissipating element.

4. The semiconductor package assembly of claim 2, wherein the heat dissipating element is distant from an edge of the socket by a gap being greater than or substantially equal to about 1 mm.

5. The semiconductor package assembly of claim 1, wherein the positioning location of the heat dissipating element is within a positioning location of the conductive pattern in the vertical projection, and
wherein in the vertical projection, the semiconductor device entirely covers the opening.

6. The semiconductor package assembly of claim 1, wherein a surface of the semiconductor device opposite to the circuit board is closer to the circuit board than a surface of the heat dissipating element opposite to the circuit board.

7. The semiconductor package assembly of claim 1, wherein a material of the conductive pattern comprises a thermally conductive material having a thermal conductivity more than 200 W/(m·K).

8. The semiconductor package assembly of claim 1, wherein the heat dissipating element comprises a plurality of heat dissipating elements surrounding the semiconductor device.

9. The semiconductor package assembly of claim 1, further comprising:
a conductive lid, disposed on the semiconductor device through a thermal interface material, wherein the conductive lid is thermally coupled to the semiconductor device,
wherein the semiconductor device is located between the circuit board and the conductive lid in the stacking direction, and the semiconductor device and the conductive lid are next to the heat dissipating element in a lateral direction.

10. A semiconductor package assembly, comprising:
a circuit board, comprising a conductive pattern and conductive contacts surrounded by the conductive pattern;
a plurality of cooling modules, standing on and thermally coupled to the conductive pattern;
a semiconductor package, disposed over the circuit board, wherein the semiconductor package is thermally connected to the plurality of cooling modules through the conductive pattern and is electrically connected to the circuit board through the conductive contacts; and
a conductive lid, disposed over the semiconductor package through a thermal interface material, wherein the conductive lid is thermally coupled to the semiconductor package.

11. The semiconductor package assembly of claim 10, wherein the conductive pattern comprises a pre-determined pattern of a cross-shape which having an opening located at a center thereof, and the conductive contacts are located inside the opening.

12. The semiconductor package assembly of claim 10, wherein the conductive pattern comprises a pre-determined pattern of a frame shape, and the conductive contacts are located inside an opening of the frame shape.

13. The semiconductor package assembly of claim 10, wherein the conductive pattern comprises a plurality of sub-patterns separated from one another, wherein the sub-patterns are arranged into a pre-determined pattern in a concentric manner with an opening located at a center thereof, and the conductive contacts are located inside the opening.

14. The semiconductor package assembly of claim 10, further comprising:
a socket, disposed on the circuit board and connected to the conductive pattern and the conductive contacts,
wherein:
in a stacking direction of the semiconductor package and the circuit board, the socket is disposed between the semiconductor package and the circuit board, and the semiconductor package is disposed between the socket and the conductive lid,
in a lateral direction, the semiconductor package, the socket and the conductive lid are next to and surrounded by the plurality of cooling modules, and
the semiconductor package is electrically connected to the circuit board through the socket and the conductive contacts and is thermally coupled to the plurality of cooling modules through the socket and the conductive pattern.

15. The semiconductor package assembly of claim 14, wherein in a vertical projection on the circuit board along the stacking direction of the semiconductor package and the circuit board, the plurality of cooling modules independently have a shape of rectangle, square, strip, or frame, and the plurality of cooling modules are separated from an edge of the socket by a gap being greater than or substantially equal to about 1 mm.

16. A semiconductor package assembly, comprising:

a circuit board;

a heat dissipating element, disposed over the circuit board; and a semiconductor device, disposed over the circuit board on a socket disposed thereon, the semiconductor device being thermally connected to the heat dissipating element through the circuit board and the socket, and the heat dissipating element being laterally next to the semiconductor device.

17. The semiconductor package assembly of claim 16, wherein the semiconductor device and the socket are framed by and distant from the heat dissipating element.

18. The semiconductor package assembly of claim 16, wherein the socket comprises:

a body;

a plurality of first connectors, penetrating through the body and connecting to the circuit board; and a plurality of second connectors, penetrating through the body and connecting to the circuit board, the plurality of second connectors surrounding the plurality of first connectors, wherein the semiconductor device electrically coupled to the circuit board through the plurality of first connectors of the socket, and the semiconductor device thermally coupled to the heat dissipating element through the plurality of first connectors of the socket.

19. The semiconductor package assembly of claim 16, further comprising:

a lid; and a thermal interface material, thermally coupling and interposed between the lid and the semiconductor device, wherein a projection of the lid is offset from a projection of the heat dissipating element along a stacking direction of the semiconductor device and the circuit board.

20. The semiconductor package assembly of claim 16, wherein the heat dissipating element comprises:

a plurality of heat dissipating blocks, separating from one another, wherein the plurality of heat dissipating blocks are arranged to surround the semiconductor device; or a frame-shaped heat dissipating block, having an opening penetrating therethrough, wherein the semiconductor device is disposed inside the opening.

* * * * *